United States Patent
Zahorik et al.

(10) Patent No.: US 6,316,784 B1
(45) Date of Patent: *Nov. 13, 2001

(54) METHOD OF MAKING CHALCOGENIDE MEMORY DEVICE

(75) Inventors: Russell C. Zahorik; Alan R. Reinberg, both of Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/041,546

(22) Filed: Mar. 12, 1998

Related U.S. Application Data

(62) Division of application No. 08/686,493, filed on Jul. 22, 1996, now Pat. No. 5,789,277.

(51) Int. Cl.$^7$ .................................................. H01L 47/00
(52) U.S. Cl. ..................... 257/3; 257/4; 257/530
(58) Field of Search .................. 257/530, 1, 2, 257/3, 4, 5

(56) References Cited

U.S. PATENT DOCUMENTS

| | | | |
|---|---|---|---|
| 3,423,646 | 1/1969 | Cubert et al. | 317/234 |
| 3,796,926 | 3/1974 | Cole et al. | 317/234 R |
| 4,099,260 | 7/1978 | Lynes et al. | 365/105 |
| 4,115,872 | 9/1978 | Bluhm | 365/163 |
| 4,174,521 | 11/1979 | Neale | 357/45 |
| 4,194,283 | 3/1980 | Hoffmann | 29/571 |
| 4,203,123 | 5/1980 | Shanks | 327/2 |
| 4,227,297 | 10/1980 | Angerstein | 29/571 |
| 4,272,562 | 6/1981 | Wood | 427/87 |
| 4,458,260 | 7/1984 | McIntyre et al. | 357/30 |
| 4,499,557 | 2/1985 | Holmberg et al. | 365/163 |
| 4,502,208 | 3/1985 | McPherson | 29/584 |
| 4,569,698 | 2/1986 | Feist | 148/1.5 |
| 4,666,252 | 5/1987 | Yaniv et al. | 350/333 |
| 4,677,742 | 7/1987 | Johnson | 29/591 |
| 4,757,359 | 7/1988 | Chiao et al. | 357/23.5 |
| 4,804,490 | 2/1989 | Pryor et al. | 252/62.3 BT |
| 4,809,044 | 2/1989 | Pryor et al. | 357/2 |
| 4,823,181 | 4/1989 | Mohsen et al. | 357/51 |
| 4,876,220 | 10/1989 | Mohsen et al. | 437/170 |
| 4,876,668 | 10/1989 | Thakoor et al. | 365/163 |
| 4,881,114 | 11/1989 | Mohsen et al. | 357/54 |
| 4,892,840 | 1/1990 | Esquivel et al. | 437/52 |

(List continued on next page.)

FOREIGN PATENT DOCUMENTS

| | | | |
|---|---|---|---|
| 0 117 045 | 8/1984 | (EP) | H01L/45/00 |
| 1 319 388 | 6/1973 | (GB) | H01L/9/00 |
| 60-109266 | 6/1985 | (JP) | H01L/27/10 |

OTHER PUBLICATIONS

Kim and Kim, "Effects of High–Current Pulses on Polycrystalline Silicon Diode with n–type Region Heavily Doped with Both Boron and Phosphorus," *J. Appl. Phys.*, 53(7):5359–5360, 1982.

Neale and Aseltine, "The Application of Amorphous Materials to Computer Memories," *IEEE*, 20(2):195–205, 1973.

Pein and Plummer, "Performance of the 3–D Sidewall Flash EPROM Cell," *IEEE*, 11–14, 1993.

(List continued on next page.)

Primary Examiner—Sara Crane
(74) Attorney, Agent, or Firm—Fletcher, Yoder & Van Someren

(57) ABSTRACT

A method for fabricating chalcogenide memories in which ultra-small pores are formed in insulative layers using disposable spacers. The chalcogenide memory elements are positioned within the ultra-small pores. The chalcogenide memory elements thus defined have minimum lateral dimensions ranging from approximately 500 to 4000 Angstroms.

11 Claims, 38 Drawing Sheets

U.S. PATENT DOCUMENTS

| | | | |
|---|---|---|---|
| 5,144,404 | | 9/1992 | Iranmanesh et al. .................. 357/51 |
| 5,166,096 | | 11/1992 | Cote et al. ............................. 437/195 |
| 5,166,758 | | 11/1992 | Ovshinsky et al. ...................... 257/3 |
| 5,177,567 | | 1/1993 | Klersy et al. ............................. 257/4 |
| 5,296,716 | | 3/1994 | Ovshinsky et al. ...................... 257/3 |
| 5,335,219 | | 8/1994 | Ovshinsky et al. .................. 369/288 |
| 5,341,328 | | 8/1994 | Ovshinsky et al. .................. 365/163 |
| 5,359,205 | | 10/1994 | Ovshinsky ............................... 257/3 |
| 5,363,329 | | 11/1994 | Troyan ................................ 365/184 |
| 5,469,479 | * | 11/1995 | Hawley ................................ 257/530 |
| 5,508,220 | * | 4/1996 | Eltoukhy et al. .................... 257/530 |
| 5,510,629 | | 4/1996 | Karpovich et al. .................... 257/50 |
| 5,534,711 | | 7/1996 | Ovshinsky et al. ...................... 257/3 |
| 5,534,712 | | 7/1996 | Ovshinsky et al. ...................... 217/3 |
| 5,536,947 | | 7/1996 | Klersy et al. ............................. 257/3 |
| 5,789,277 | * | 8/1998 | Zahorik et al. ......................... 438/95 |
| 5,792,704 | * | 8/1998 | Jun et al. ............................. 438/624 |
| 5,847,460 | * | 12/1998 | Liou et al. ............................ 257/635 |

OTHER PUBLICATIONS

Post and Ashburn, "Investigation of Boron Diffusion in Polysilicon and its Application to the Design of p–n–p Polysilicon Emitter Bipolar Transistors with Shallow Emitter Junctions," *IEEE*, 38(11):2442–2451, 1991.

Post et al., "Polysilicon Emitters for Bipolar Transistors: A Review and Re–Evaluation of Theory and Experiment," *IEEE*, 39(7):1717–1731, 1992.

Post and Ashburn, "The Use of an Interface Anneal to Control the Base Current and Emitter Resistance of p–n–p Polysilicon Emitter Bipolar Transistors," *IEEE*, 13(8):408–410, 1992.

Rose et al., "Amorphous Silicon Analogue Memory Devices," *J. Non–Crystalline Solids*, 115:168–170, 1989.

Schaber et al., "Laser Annealing Study of the Grain Size Effect in Polycrystalline Silicon Schottky Diodes," *J. Appl. Phys.*, 53(12):8827–8834, 1982.

Yamamoto et al., "The I–V Characteristics of Polycrystalline Silicon Diodes and the Energy Distribution of Traps in Grain Boundaries," *Electronics and Communications in Japan*, Part 2, 75(7):51–58, 1992.

Yeh et al., "Investigation of Thermal Coefficient for Polycrystalline Silicon Thermal Sensor Diode," *Jpn. J. Appl. Phys.*, 31(Part 1, No. 2A):151–155, 1992.

Oakley et al., "Pillars—The Way to Two Micron Pitch Multilevel Metallisation," *IEEE*, 23–29, 1984.

* cited by examiner

METHOD OF MAKING CHALCOGENIDE MEMORY DEVICE

This application is a Divisional of application Ser. No. 08/686,493, filed Jul. 22, 1996, now U.S. Pat. No. 5,789,277.

BACKGROUND OF THE INVENTION

The present invention relates generally to semiconductor fabrication techniques and, more particularly, to a method for fabricating ultra-small electrodes for use in phase or state changeable memory devices such as, for example, chalcogenide memory cells.

The use of electrically writable and erasable phase change materials (i.e., materials which can be electrically switched between generally amorphous and generally crystalline states or between different resistive states while in crystalline form) for electronic memory applications is known in the art and is disclosed, for example, in U.S. Pat. No. 5,296,716 to Ovshinsky et al., the disclosure of which is incorporated herein by reference. U.S. Pat. No. 5,296,716 is believed to indicate generally the state of the art, and to contain a discussion of the current theory of operation of chalcogenide materials.

Generally, as disclosed in the aforementioned Ovshinsky patent, such phase change materials can be electrically switched between a first structural state where the material is generally amorphous and a second structural state where the material has a generally crystalline local order. The material may also be electrically switched between different detectable states of local order across the entire spectrum between the completely amorphous and the completely crystalline states. That is, the switching of such materials is not required to take place between completely amorphous and completely crystalline states but rather the material can be switched in incremental steps reflecting changes of local order to provide a "gray scale" represented by a multiplicity of conditions of local order spanning the spectrum from the completely amorphous state to the completely crystalline state.

The material exhibits different electrical characteristics depending upon its state. For instance, in its amorphous state the material exhibits a lower electrical conductivity than it does in its crystalline state.

These memory cells are monolithic, homogeneous, and formed of chalcogenide material selected from the group of Te, Se, Sb, Ni, and Ge. Such chalcogenide materials can be switched between numerous electrically detectable conditions of varying resistivity in nanosecond time periods with the input of picojoules of energy. The resulting memory material is truly non-volatile and will maintain the integrity of the information stored by the memory cell without the need for periodic refresh signals. Furthermore, the data integrity of the information stored by these memory cells is not lost when power is removed from the device. The subject memory material is directly overwritable so that the memory cells need not be erased (set to a specified starting point) in order to change information stored within the memory cells. Finally, the large dynamic range offered by the memory material provides for the gray scale storage of multiple bits of binary information in a single cell by mimicking the binary encoded information in analog form and thereby storing multiple bits of binary encoded information as a single resistance value in a single cell.

The operation of chalcogenide memory cells requires that a region of the chalcogenide memory material, called the chalcogenide active region, be subjected to a current pulse typically with a current density between about $10^5$ and $10^7$ amperes/cm$^2$, to change the crystalline state of the chalcogenide material within the active region contained within a small pore. This current density may be accomplished by first creating a small opening in a dielectric material which is itself deposited onto a lower electrode material. A second dielectric layer, typically of silicon nitride, is then deposited onto the dielectric layer and into the opening. The second dielectric layer is typically on the order of 40 Angstroms thick. The chalcogenide material is then deposited over the second dielectric material and into the opening. An upper electrode material is then deposited over the chalcogenide material. Carbon is a commonly used electrode material, although other materials have also been used, for example, molybdenum and titanium nitride. A conductive path is then provided from the chalcogenide material to the lower electrode material by forming a pore in the second dielectric layer by the well known process of firing. Firing involves passing an initial high current pulse through the structure which passes through the chalcogenide material and then provides dielectric breakdown of the second dielectric layer, thereby providing a conductive path via the pore through the memory cell.

Electrically firing the thin silicon nitride layer is not desirable for a high density memory product due to the high current required and the large amount of testing time that is required for the firing.

The active regions of the chalcogenide memory cells within the pores are believed to change crystalline structure in response to applied voltage pulses of a wide range of magnitudes and pulse durations. These changes in crystalline structure alter the bulk resistance of the chalcogenide active region. The wide dynamic range of these devices, the linearity of their response, and lack of hysteresis provide these memory cells with multiple bit storage capabilities.

Factors such as pore dimensions (diameter, thickness, and volume), chalcogenide composition, signal pulse duration and signal pulse waveform shape have an effect on the magnitude of the dynamic range of resistances, the absolute endpoint resistances of the dynamic range, and the currents required to set the memory cells at these resistances. For example, relatively large pore diameters (e.g., about 1 micron) will result in higher programming current requirements, while relatively small pore diameters (e.g., about 500 Angstroms) will result in lower programming current requirements. The most important factor in reducing the required programming current is the pore cross sectional area.

The energy input required to adjust the crystalline state of the chalcogenide active region of the memory cell is directly proportional to the dimensions of the minimum lateral dimension of the pore (e.g., smaller pore sizes result in smaller energy input requirement). Conventional chalcogenide memory cell fabrication techniques provide a minimum lateral pore dimension, diameter or width of the pore, that is limited by the photolithographic size limit. This results in pore sizes having minimum lateral dimensions down to approximately 0.35 micron.

The present invention is directed to overcoming, or at least reducing the affects of, one or more of the problems set forth above. In particular, the present invention provides a method for fabricating chalcogenide memory cells with minimum lateral dimensions below the photolithographic limit thereby reducing the required energy input to the chalcogenide active region in operation. The fabrication process for the chalcogenide memory cells further utilize reduced numbers of photolithographic masking processes thereby simplifying the fabrication process. As a result, the memory cells may be made smaller to provide denser memory arrays, and the overall power requirements for the memory cell are minimized.

SUMMARY OF THE INVENTION

In accordance with one aspect of the present invention, a method of fabricating a chalcogenide memory cell is provided in which the chalcogenide memory element is contained within an ultra-small pore formed within a layer of insulative material. The method begins with the application of a layer of a first material onto a conductive substrate material. An edge feature is then formed in the layer of the first material. A layer of an insulative material is next applied onto the edge feature previously formed in the layer of the first material. A third material is then applied onto the layer of the insulative material. A portion of the layer of the third material is then removed. A portion of the layer of the insulative material is then removed to define a pore in the layer of the insulative material. A first conductive material layer is deposited into the pore. A layer of a chalcogenide material is then deposited into the pore and onto the layer of the first conductive material. Finally, a layer of a second conductive material is deposited into the pore and onto the layer of the chalcogenide material.

In accordance with another aspect of the present invention, an alternative method of fabricating a chalcogenide memory cell is provided in which the chalcogenide memory element is positioned within an ultra-small pore formed within an insulative layer. The alternative method begins with the application of a layer of a insulative material onto a conductive substrate material. A layer of a second material is then applied onto the layer of the insulative material. An edge feature is then formed in the layer of the second material. An edge feature is then formed in the layer of the insulative material. A layer of a third material is then applied onto the edge features of the layers of the insulative and second materials. A portion of the layer of the third material is then removed. A portion of the layer of the insulative material is then removed to define a pore in the layer of the insulative material. A layer of a first conductive material is then deposited into the pore. A layer of a chalcogenide material is then deposited into the pore and onto the layer of the first conductive material. Finally, a layer of a second conductive material is deposited into the pore and onto the layer of the chalcogenide material.

In accordance with yet another aspect of the present invention, yet another alternative method of fabricating a chalcogenide memory cell is provided in which the chalcogenide memory element is positioned within an ultra-small pore formed within an insulative layer. The method generally begins with the application of a layer of an insulative material onto a conductive substrate material. A layer of a second material is then applied onto the layer of the insulative material. A layer of a third material is then applied onto the layer of the second material. An edge feature is then formed in the layer of the third material. A fourth material is then applied onto said edge feature of the layer of the third material. A portion of the layer of the fourth material is then removed. A portion of the layer of the second material is then removed to define a pore in the layer of the second material. A portion of the layer of the insulative material is then removed to define a pore in the layer of the insulative material. A layer of a first conductive material is then deposited into the pore. A layer of chalcogenide material is then deposited into the pore and onto the layer of the first conductive material. Finally, a layer of a second conductive material is deposited into the pore and onto the layer of the chalcogenide material.

The chalcogenide memory cells thus defined have a minimum lateral dimension ranging from approximately 500 to 4000 Angstroms.

DESCRIPTION OF THE DRAWINGS

The present invention will become more fully understood from the following detailed description of the preferred embodiments, taken in conjunction with the accompanying drawings in which.

DETAILED DESCRIPTION OF PREFERRED EMBODIMENTS

A method of fabricating chalcogenide memories is presented that provides memory sizes smaller than that presently provided using conventional photolithographic methods. In particular, the preferred embodiment of the present invention provides a method of fabricating chalcogenide memories that relies upon disposable spacers to define the minimum lateral dimension of a pore into which the chalcogenide memory is positioned. In this manner, chalcogenide memories having minimum lateral dimensions as small as around 500 Angstroms are obtained.

Figure 1:
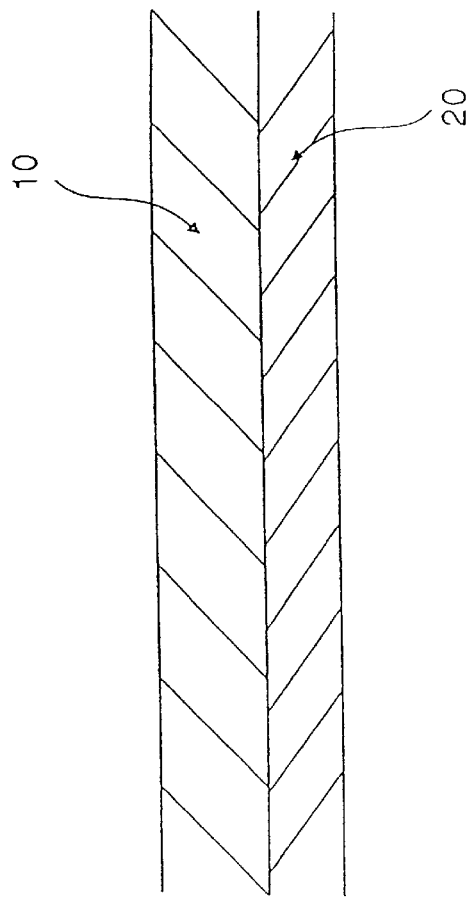
FIG. 1 is a fragmentary cross sectional view of the deposition of a layer of tetraethylorthosilicate (TEOS) oxide onto a substrate of titanium nitride in accordance with a first preferred embodiment of the present invention.

Turning to the drawings and referring initially to FIGS. 1 to 10, a first preferred embodiment of a method for fabricating chalcogenide memories will now be described. A layer 10 of tetraethylorthosilicate (TEOS) oxide is first deposited onto a substrate 20 of titanium nitride using convention thin film deposition techniques as shown in FIG. 1. The layer 10 may have a substantially uniform thickness ranging from about 100 to 5000 Angstroms, and preferably it will have a substantially uniform thickness of approximately 2000 Angstroms. The layer 10 may be comprised of TEOS oxide or plasma enhanced chemical vapor deposition (PECVD) of $SiO_2$, and preferably will be comprised of TEOS oxide. The substrate 20 may be comprised of a conductive material such as, for example, TiN, Carbon, $WiSi_x$, or Tungsten, and preferably will be comprised of TiN. The substrate will further preferably comprise a lower electrode grid used for accessing an array of chalcogenide memories.

Figure 2:
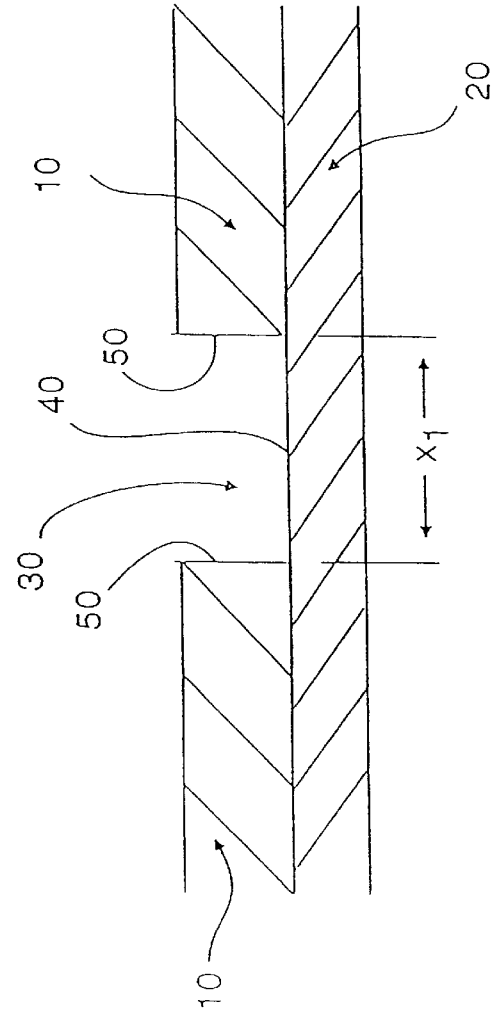
FIG. 2 is a fragmentary cross sectional view of the formation of an opening in the layer of TEOS oxide of FIG. 1.
Figure 2A:
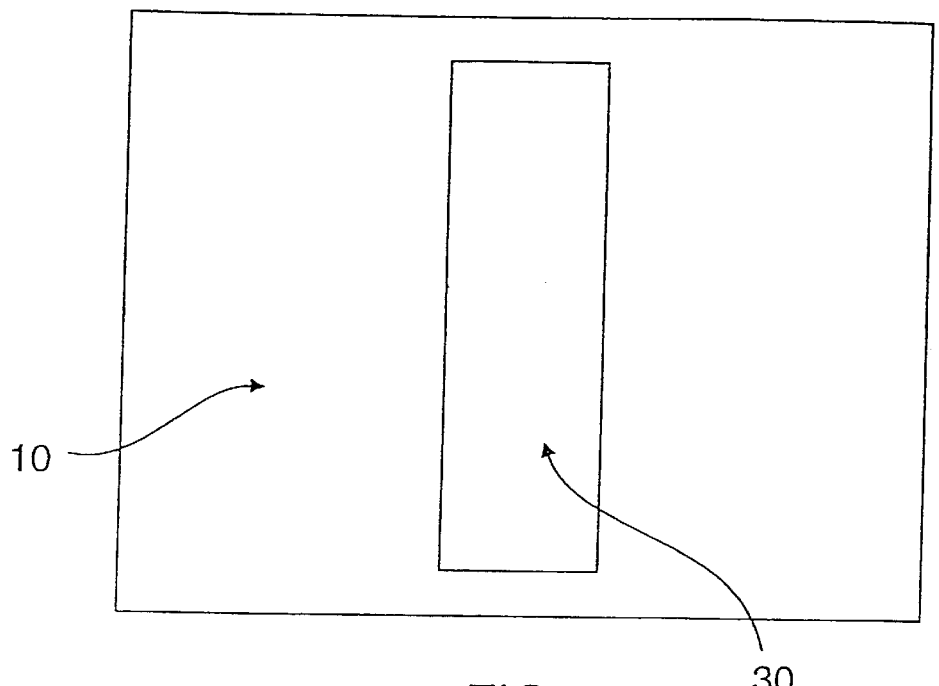
FIG. 2a is an overhead view of a generally rectangular opening formed in the layer of TEOS oxide of FIG. 1.
Figure 2B:
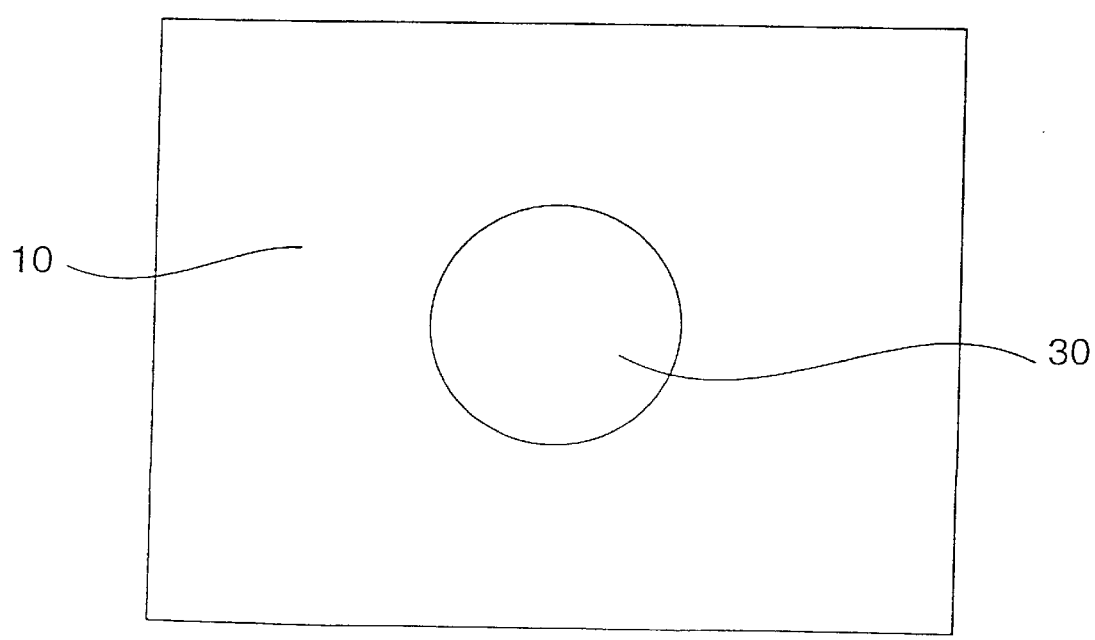
FIG. 2b is an overhead view of a generally circular opening formed in the layer of TEOS oxide of FIG. 1.

An opening 30, extending to the layer 20, is then etched in the layer 10 using conventional anisotropic etching and masking techniques as shown in FIG. 2. The opening 30 may be formed, for example, as a generally rectangular channel as shown in FIG. 2a, or as a substantially circular opening in the layer 10 as shown in FIG. 2b. The opening 30 is preferably formed using a conventional contact hole mask resulting in the substantially circular opening shown in FIG. 2b. The minimum lateral dimension $x_1$ of the opening 30 may range from about 2500 to 8000 Angstroms, and preferably it will be approximately 5000 Angstroms. The opening 30 includes a generally horizontal bottom surface 40, common to the layer 20, and generally vertical side walls 50 at its outer periphery.

Figure 3:
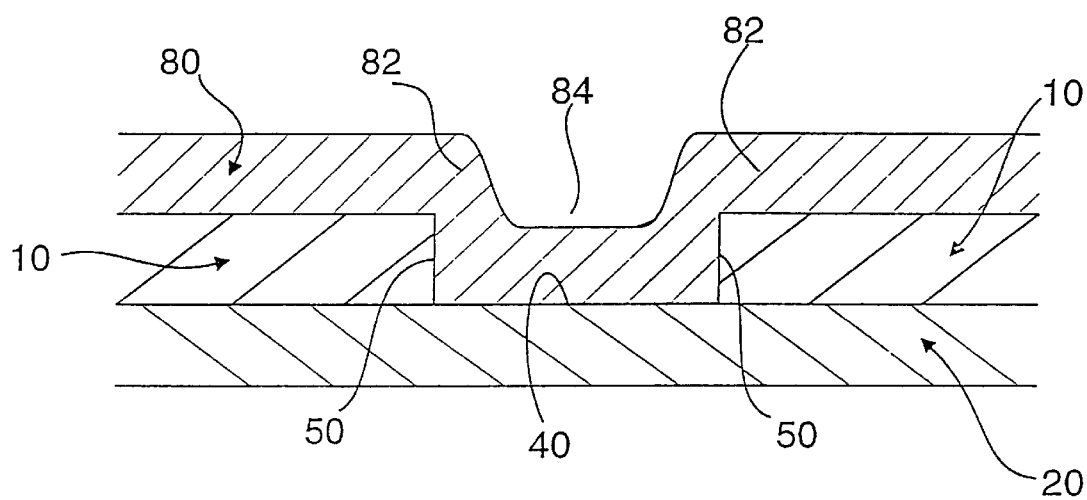
FIG. 3 is a fragmentary cross sectional view of the deposition of a layer of silicon nitride onto the layer of TEOS oxide and into the opening in the layer of TEOS oxide of FIG. 2.

A layer 80 of silicon nitride is then deposited onto the layer 10 and bottom surface 40 using conventional thin film deposition techniques as shown in FIG. 3. The portion of the layer 80 positioned within the opening 30 includes generally vertical side walls 82 extending downward to a generally horizontal surface 84. The layer 80 may have a substantially uniform thickness ranging from about 100 to 5000 Angstroms, and preferably it will have a substantially uniform thickness of approximately 1800 Angstroms. The layer 80 may comprise a dielectric material such as, for example, TEOS oxide, PECVD oxide, or silicon nitride, and preferably it will comprise silicon nitride.

Figure 4:
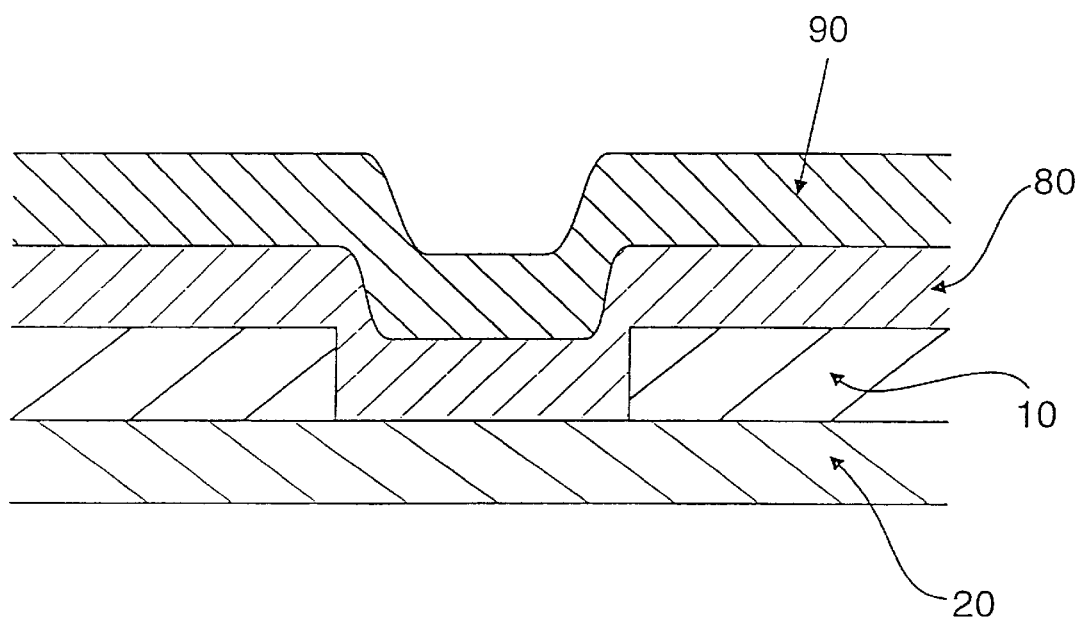
FIG. 4 is a fragmentary cross sectional view of the deposition of a layer of polysilicon onto the layer of silicon nitride and opening of FIG. 3.
Figure 5:
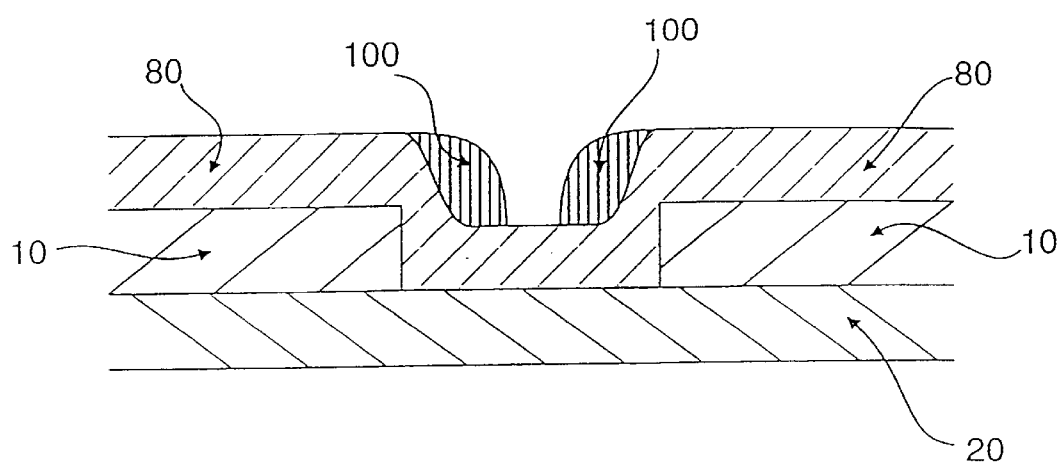
FIG. 5 is a fragmentary cross sectional view of the etching of the layer of polysilicon of FIG. 4 to form a spacer.

A layer 90 of polysilicon is then deposited onto the layer 80 using conventional thin film deposition techniques as shown in FIG. 4. The layer 90 may have a substantially uniform thickness ranging from about 500 to 6000 Angstroms, and preferably it will have a substantially uniform thickness of approximately 4000 Angstroms. The layer 90 may comprise polysilicon or silicon nitride, and preferably it will comprise polysilicon. The layer 90 is then etched using conventional anisotropic etching techniques to form a spacer 100 out of the layer 90 as shown in FIG. 5. The spacer 100 is positioned at the outer periphery of the portion of the layer 80 positioned within the opening 30 and covers the generally vertical side walls 82. The bottom of the spacer 100 will have a lateral thickness substantially equal to the selected thickness of the layer 90 provided the coating of the layer 90 on the layer 80 is conformal.

Figure 6:
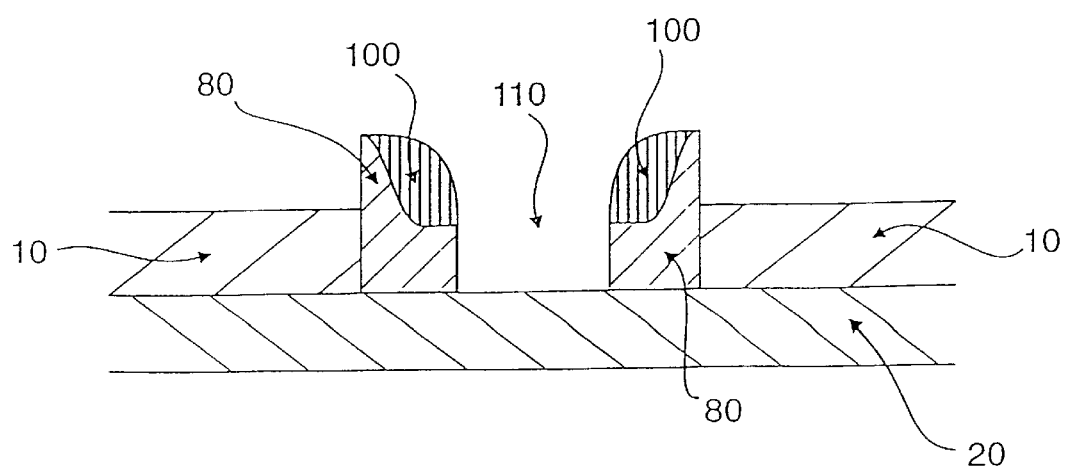
FIG. 6 is a fragmentary cross sectional view of the etching of the exposed portion of the layer of silicon nitride circumscribed by the spacer of FIG. 5 to form an opening in the layer of silicon nitride.

The portion of the layer 80 not covered by the spacer 100 is then etched using conventional anisotropic etching techniques to form an opening 110 defining a pore in the layer 80 extending to the layer 20 as shown in FIG. 6. The resulting opening 110 may have a minimum lateral dimension ranging from about 500 to 4000 Angstroms, and preferably it will have a minimum lateral dimension of approximately 1000 Angstroms. The minimum lateral dimension of the opening 110 is defined by the selected thickness of the layer 90 used to form the spacer 100. The spacer 100 is later removed using conventional wet etch techniques as will be described hereinafter. The disposable spacer 100 thus provides a means of defining the minimum lateral dimension of an ultra-small pore in the layer 80. The first preferred embodiment of the present method thus provides a means of fabricating an ultra-small pore 110 in the layer 80 by use of the disposable spacer 100 positioned adjacent to an edge feature of the layer 80.

Note that while a range of materials may be utilized for each of the layers, the particular materials selected for each of the layers must be selected to provide proper selectivity during the various etching processes as will be recognized by persons of ordinary skill in the art.

The resulting structure illustrated in FIG. 6 includes a conductive substrate 20 and a dielectric layer 80 including an opening 110. This structure is then preferably used to fabricate a chalcogenide memory cell in which the opening 110 provides a pore for placement of a chalcogenide memory cell comprising a sandwich of an upper electrode, a layer chalcogenide material, and a lower electrode.

Figure 7:
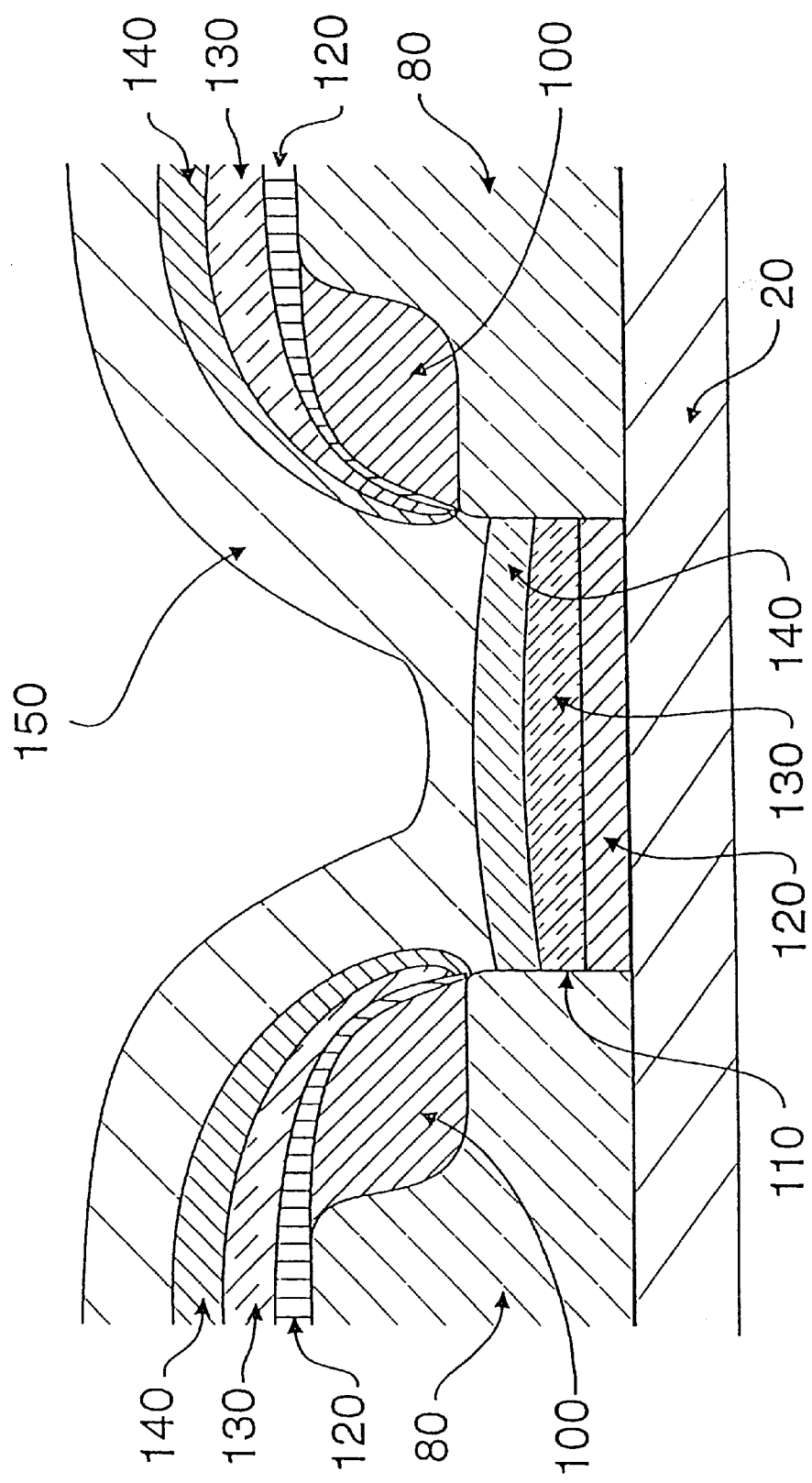
FIG. 7 is a fragmentary cross sectional view of the sequential and substantially collimated sputter deposition of carbon, chalcogenide material, and carbon followed by the deposition of silicon dioxide onto the structure of FIG. 6.

As illustrated in FIG. 7, the chalcogenide memory cell is fabricated by sequentially depositing a lower conductive layer 120 of carbon, followed by a layer 130 of chalcogenide material, and finally an upper conductive layer 140 of carbon using conventional thin film deposition techniques such as, for example, PVD. The layers 120, 130, and 140 are preferably deposited by sequential sputter deposition to provide a substantially collimated layering of the layers 120, 130, and 140 within the pore 110. The layers 120, 130, and 140 thus form the basic elements of the chalcogenide memory cell.

The layer 120 may comprise carbon, TiN, or TiW, and preferably it comprises carbon. The thickness of the layer 120 may range from approximately 200 to 1000 Angstroms, and preferably it is around 600 Angstroms.

The chalcogenide material layer 130 may range from approximately 200 to 1000 Angstroms, and preferably it is around 500 Angstroms thick. Typical chalcogenide compositions for these memory cells include average concentrations of Te in the amorphous state well below 70%, typically below about 60% and ranging in general from as low as about 23% up to about 56% Te, and most preferably to about 48% to 56% Te. Concentrations of Ge are typically above about 15% and range from a low of about 17% to about 44% average, remaining generally below 50% Ge, with the remainder of the principal constituent elements in this class being Sb. The percentages given are atomic percentages which total 100% of the atoms of the constituent elements. In a particularly preferred embodiment, the chalcogenide compositions for these memory cells comprise a Te concentration of about 55%, a Ge concentration of about 22%, and a Sb concentration of about 22%. This class of materials are typically characterized as $Te_aGe_bSb_{100-(a+b)}$, where a is equal to or less than about 70% and preferably between about 60% to about 40%, b is above about 15% and less than 50%, preferably between about 17% to about 44%, and the remainder is Sb.

The layer 140 may comprise carbon, TiN, or TiW, and preferably it comprises carbon. The thickness of the layer 140 may range from approximately 200 to 1000 Angstroms, and preferably it is around 600 Angstroms.

As illustrated in FIG. 7, following the deposition of the layers 120, 130, and 140, a protective layer 150 of silicon dioxide is deposited. The layer 150 of silicon dioxide coats the materials within the pore 110 and remains there throughout subsequent chemical mechanical polishing (CMP) operations and etching and ashing operations. As such, the layer 150 protects the layers 120, 130, and 140 within the pore 110 from attack by the chemical etchants used in these subsequent operations. The layer 150 may be deposited using conventional thin film deposition techniques such as, for example, low pressure chemical vapor deposition (LPCVD), and preferably it is deposited by PECVD. The layer 150 may comprise silicon dioxide, TEOS, or $Si_3N_4$, and preferably it is TEOS. The layer 150 may range in thickness from approximately 200 to 10,000 Angstroms, and preferably it is around 5000.

Figure 8:
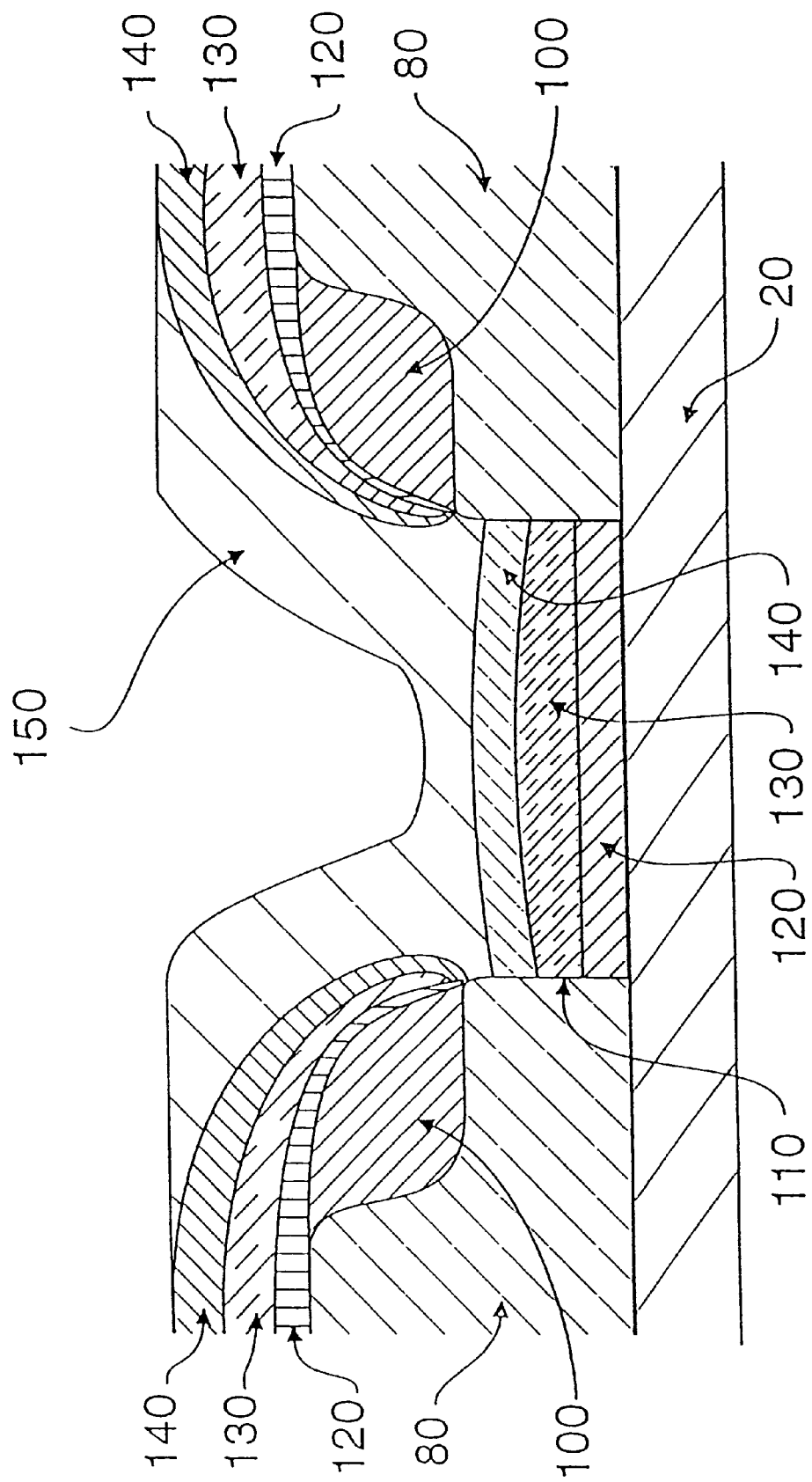
FIG. 8 is a fragmentary cross sectional view of the structure of FIG. 7 following a chemical mechanical polishing (CMP) operation to remove a portion of the silicon dioxide layer.
Figure 9:
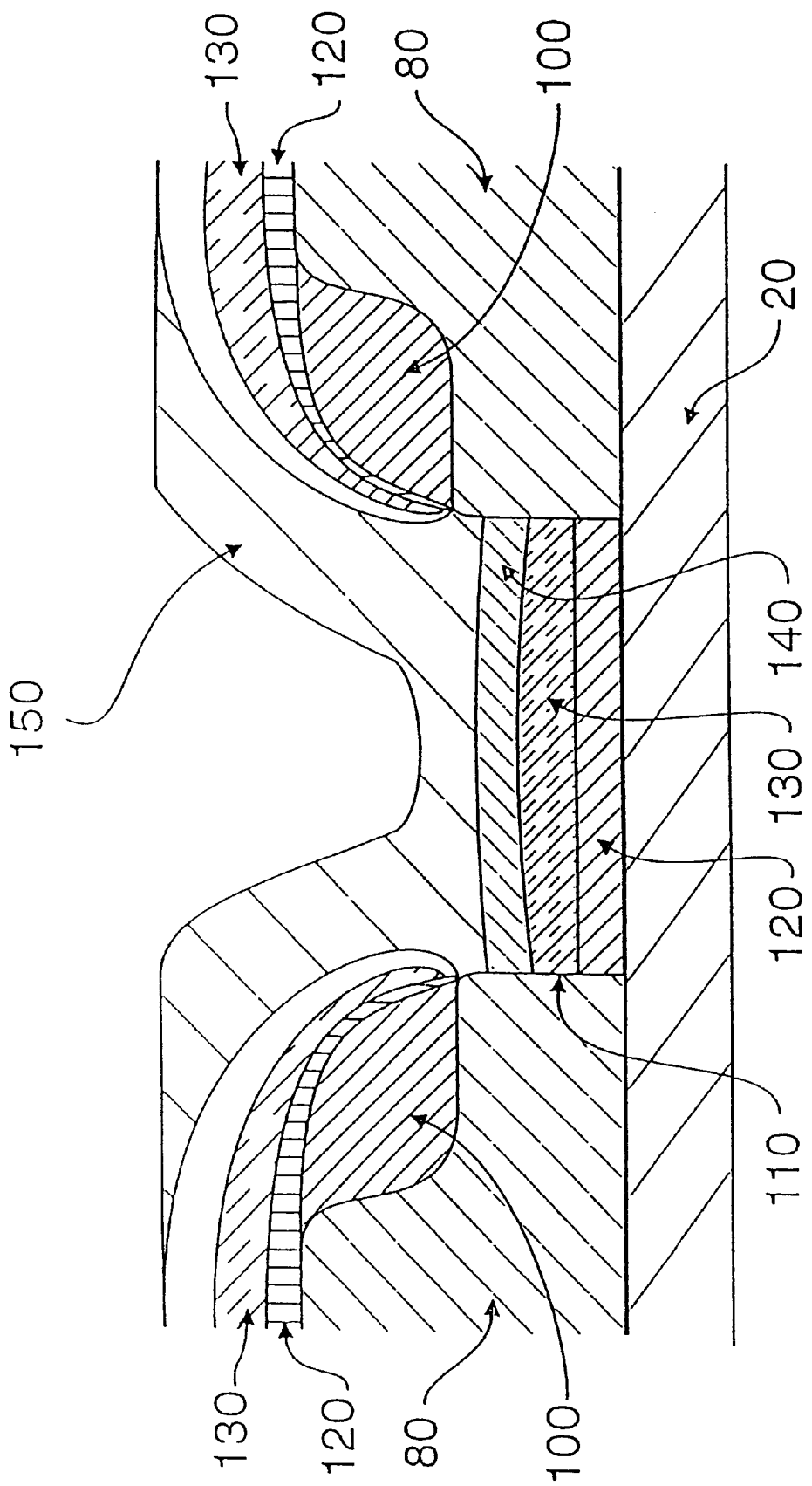
FIG. 9 is a fragmentary cross sectional view of the structure of FIG. 8 following an ashing operation to remove the carbon layer not covered by the silicon dioxide layer.
Figure 10:
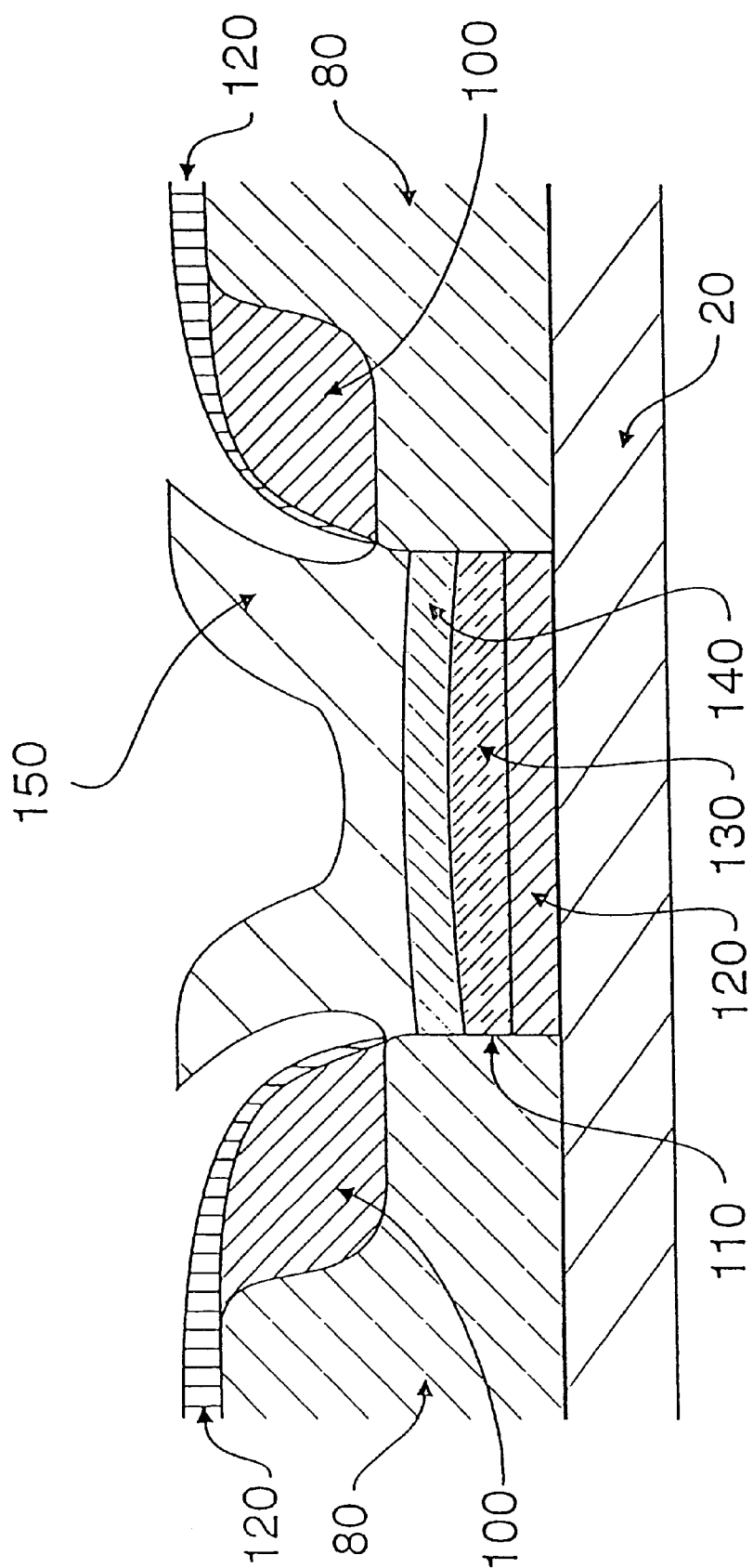
FIG. 10 is a fragmentary cross sectional view of the structure of FIG. 9 following chemical mechanical polishing (CMP) and wet etch operation to remove the chalcogenide material not covered by the silicon dioxide layer.
Figure 11:
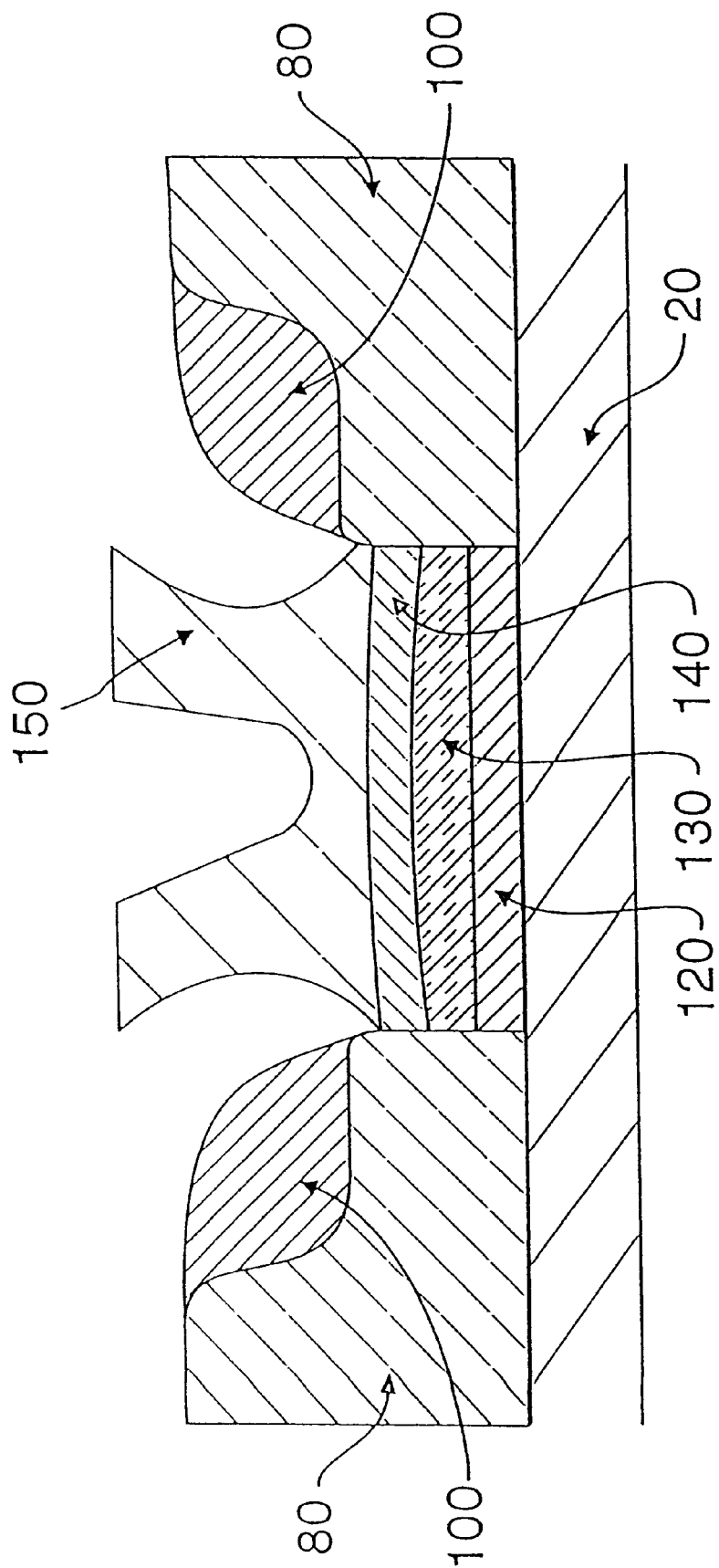
FIG. 11 is a fragmentary cross sectional view of the structure of FIG. 10 following an ashing operation to remove the carbon layer not covered by the silicon dioxide layer.

Referring to FIGS. 8–11, during subsequent chemical mechanical polishing (CMP) and etching operations which remove the layers 120, 130, and 140 outside of the pore 110, the layer 150 of TEOS within the pore 110 protects the layers 120, 130, and 140 within the pore 110. Referring to FIG. 8, the outermost portion of the layer 150 of TEOS may first be removed by a conventional chemical mechanical polishing (CMP) operation. The carbon layer 140 provides a CMP etch stop during the operation. Referring to FIG. 9, the carbon layer 140 may then be removed by exposure to a conventional oxygen plasma or other similar "ashing" operation. The ashing operation is preferred to a CMP operation since CMP typically does not remove carbon very well. Referring to FIG. 10, the chalcogenide layer 130 may then be removed by a conventional chemical mechanical polishing (CMP) operation, but preferably it is removed by a combination of CMP and a conventional wet etch process which will stop on the carbon layer 120. In this manner, residue of the chalcogenide layer 130 is removed that would not be removed by CMP processing alone. Referring to FIG. 11, the carbon layer 140 may then be removed by a conventional "ashing" operation. Note that throughout the CMP and/or etching operations illustrated in FIGS. 8–11, the remaining layer 150 of TEOS protects the materials within the pore 110.

Figure 12:
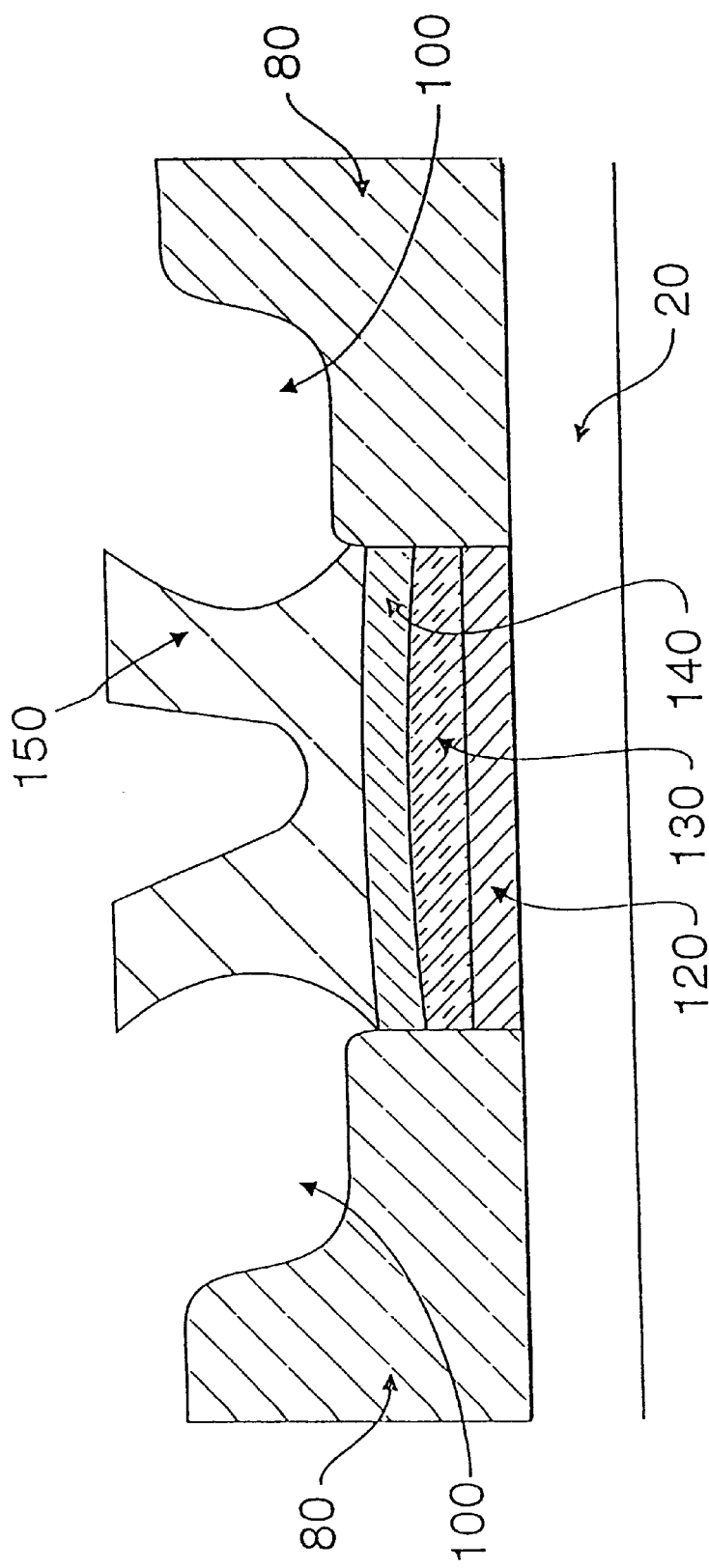
FIG. 12 is a fragmentary cross sectional view of the structure of FIG. 11 following a wet etch process to remove the disposable polysilicon spacer.
Figure 13:
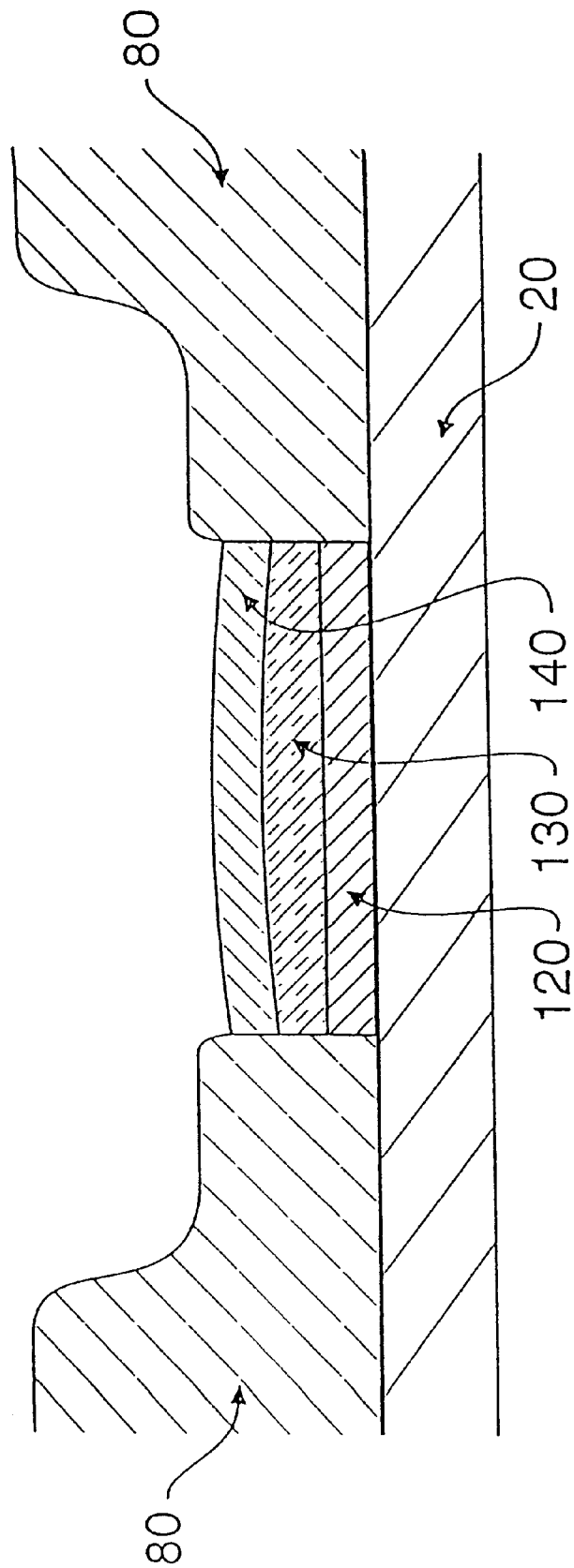
FIG. 13 is a fragmentary cross sectional view of the structure of FIG. 12 following a wet etch process to remove the remaining portion of the layer of silicon dioxide.
Figure 14:
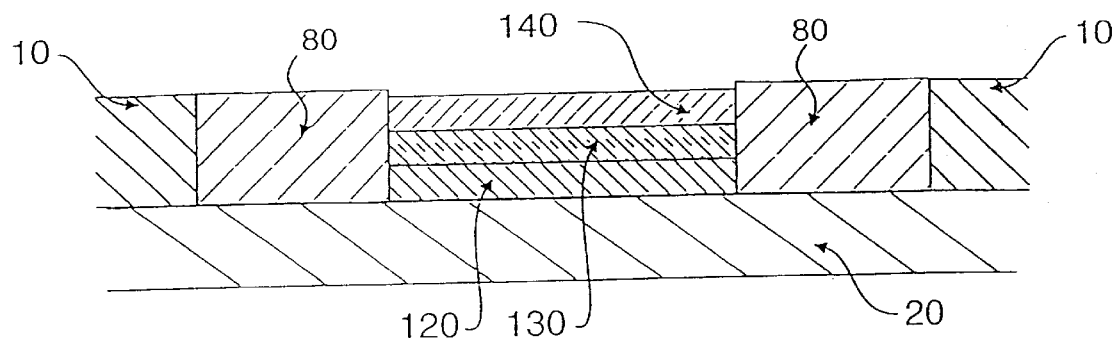
FIG. 14 is a fragmentary cross sectional view of the structure of FIG. 13 following a chemical mechanical polishing (CMP) operation.

Referring to FIG. 12, the disposable spacer 100 of polysilicon may now be removed using a conventional wet etch process using, for example, $NH_4OH$. The remaining portion of the layer 150 of TEOS also protects the materials within the pore 110 during this operation. Finally, referring to FIG. 13, the remaining portion of the layer 150 of TEOS may be removed using a conventional oxide wet etch process. In preparation for the final processing steps, the structure illustrated in FIG. 13 may then be subjected to a conventional chemical mechanical polishing (CMP) operation as shown in FIG. 14 to provide a substantially planar topography.

Figure 15:
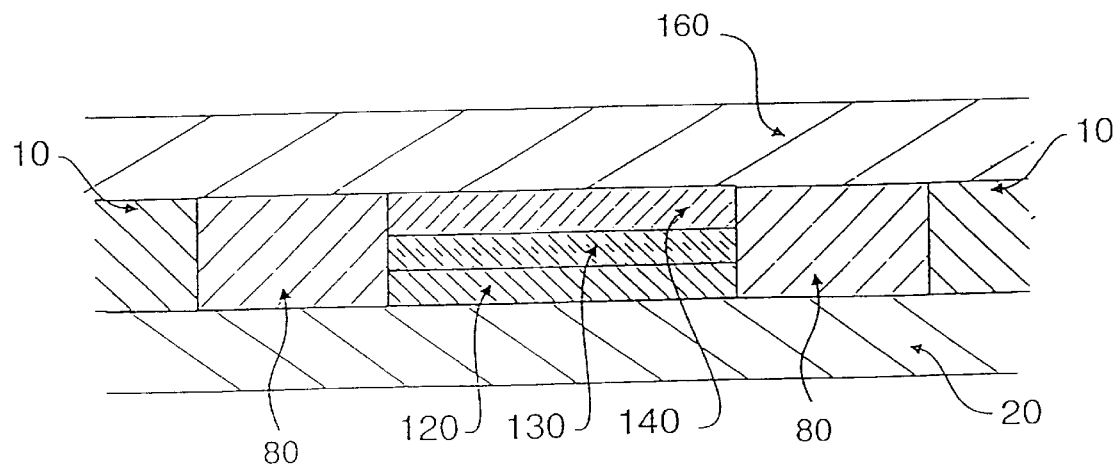
FIG. 15 is a fragmentary cross sectional view of the structure of FIG. 14 following the deposition of a layer of silicon dioxide.
Figure 16:
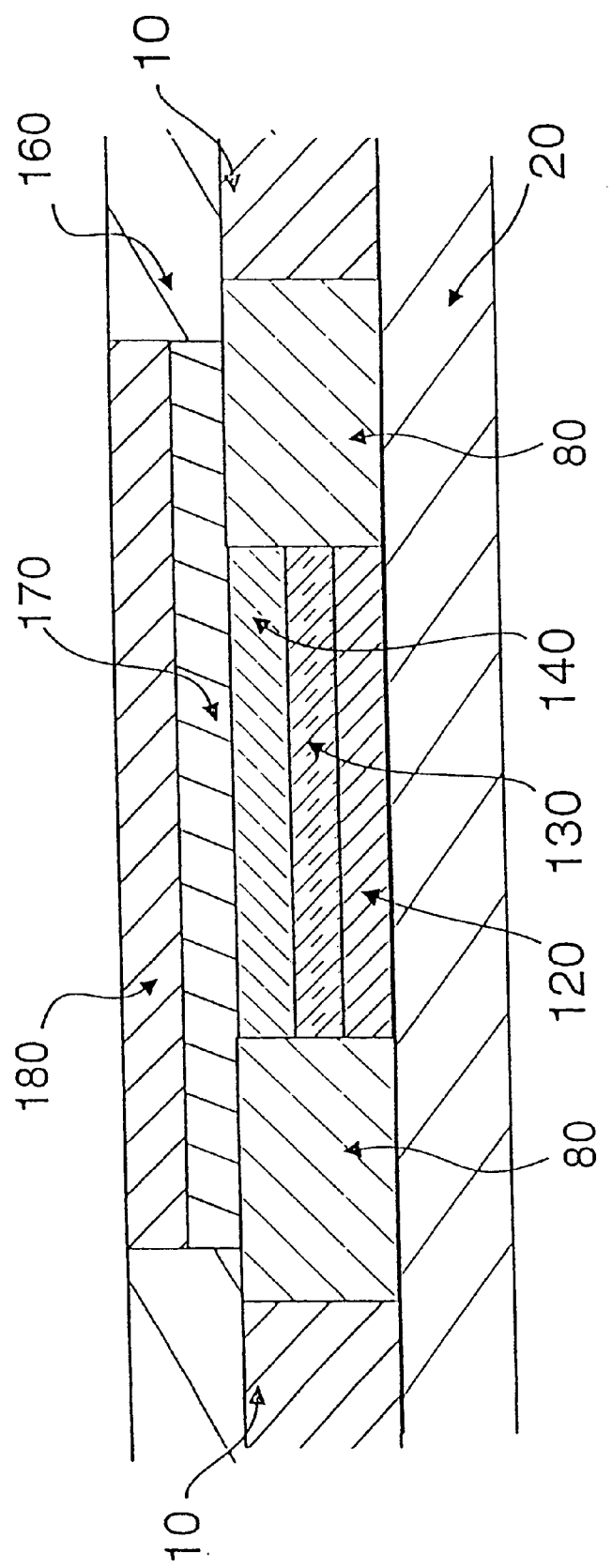
FIG. 16 is a fragmentary cross sectional view of the structure of FIG. 15 following a masking and etching operation to expose the upper layer of carbon followed by the successive deposition of a TiN barrier metal layer and an aluminum metalization layer.

The remaining processing steps illustrated in FIGS. 15 and 16 permit electrical connection of the chalcogenide memory within the pore 110 to a conductive upper grid. As illustrated in FIG. 15, an insulating layer 160 of silicon dioxide may then be deposited using conventional thin film deposition methods. The layer 160 may then be masked and etched using conventional methods to provide access to the layer 140 of carbon within the pore 110. A conductive layer 170 of a barrier metal such as, for example, TiN is then deposited using conventional thin film deposition methods. The conductive layer 170 may comprise a conductive material such as, for example, TiN, TiW, or TiAl, and preferably it comprises TiN. The conductive layer 170 may range in thickness from approximately 100 to 2000 Angstroms, and preferably it is 500 Angstroms in thickness. A conductive layer 180 of aluminum may then be applied using conventional metallization processes. The conductive layer 180 preferably comprises an upper conductive grid for an array of chalcogenide memories. The conductive layer 180 may comprise a conductive material such as, for example, aluminum alloy, TiW, or CVD W on TiN, and preferably it comprises Al/Cu. The conductive layer 180 may range in thickness from approximately 200 to 10,000 Angstroms, and preferably it is 7500 Angstroms in thickness.

In a particularly preferred embodiment, the methods described are utilized to form an array of chalcogenide memory cells which are addressable by an X-Y grid of upper and lower conductors. In the particularly preferred embodiment, diodes are further provided in series with the chalcogenide memories in order to permit read/write operations from/to individual chalcogenide memory cells as will be recognized by persons of ordinary skill in the art.

Figure 17:
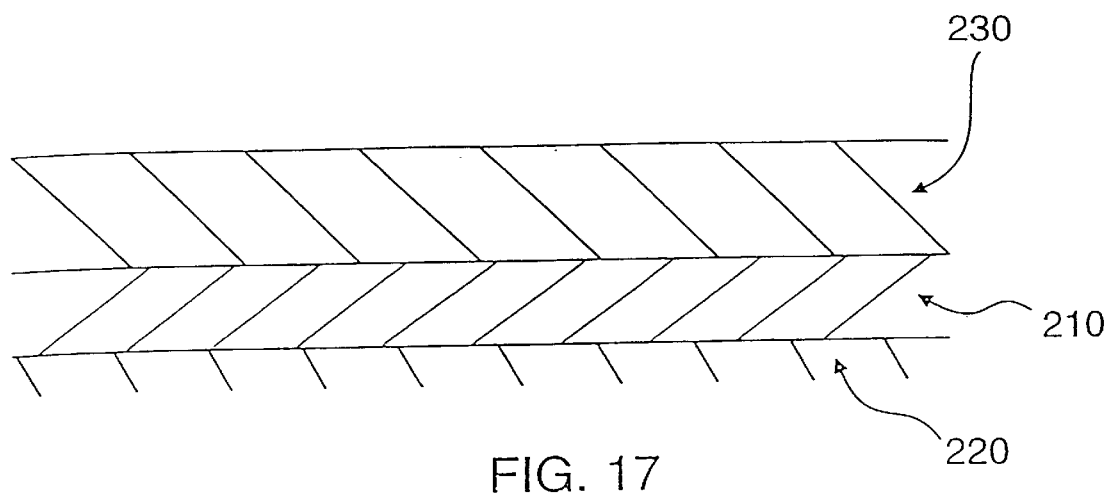
FIG. 17 is a fragmentary cross sectional view of the deposition of layers of silicon nitride and polysilicon onto a substrate of titanium nitride in accordance with a second preferred embodiment of the present invention.

Referring to FIGS. 17 to 31, a second preferred embodiment of a method of fabricating ultra-small electrodes for chalcogenide memory cells will now be described. A layer 210 of silicon nitride is first deposited onto a substrate 220 of titanium nitride. A layer 230 of polysilicon is then deposited onto the layer 210. The layers 210 and 230 are deposited using conventional thin film deposition techniques as shown in FIG. 17. The layer 210 may have a substantially uniform thickness ranging from about 100 to 1000 Angstroms, and preferably it will have a substantially uniform thickness of approximately 500 Angstroms. The layer 210 may be comprised of an insulating material such as, for example, TEOS oxide, silicon nitride, or PECVD oxide, and preferably will be comprised of silicon nitride. The layer 230 may have a substantially uniform thickness ranging from about 500 to 6000 Angstroms, and preferably it will have a substantially uniform thickness of approximately 4000 Angstroms. The layer 230 may be comprised of TEOS oxide, PECVD oxide, or polysilicon, and preferably will be comprised of polysilicon. The substrate 220 may be comprised of a conductive material such as, for example, TiN, carbon, $WSi_x$ or TiW, and preferably will be comprised of TiN. In a preferred embodiment, the substrate 220 will comprise a conductive lower grid for accessing an array of chalcogenide memory cells.

Figure 18:
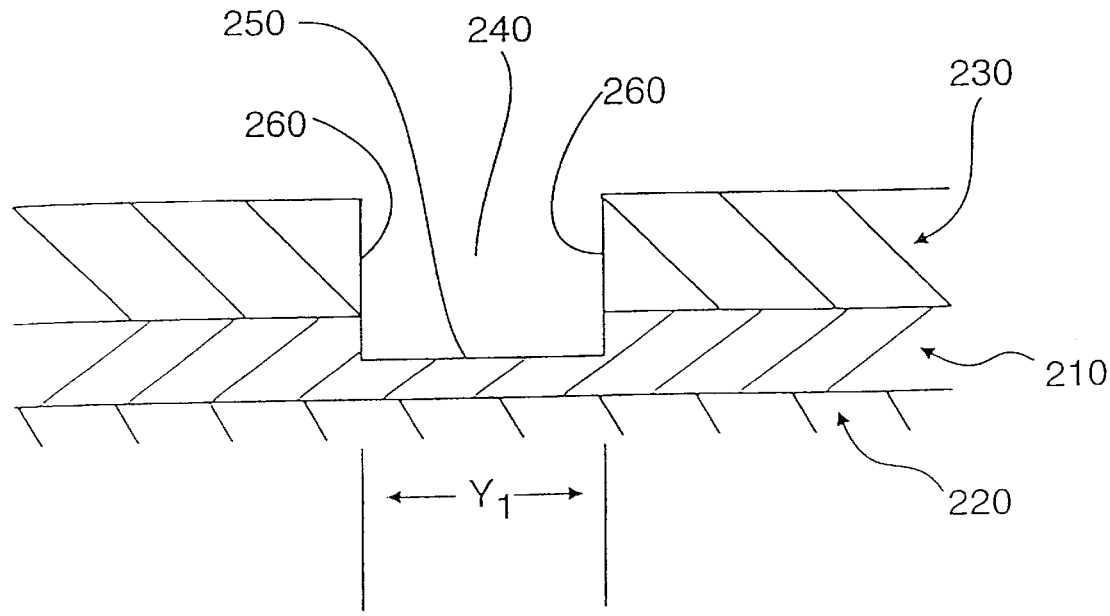
FIG. 18 is a fragmentary cross sectional view of the formation of an opening in the layer of polysilicon and a recess in the layer of silicon nitride of FIG. 17.

An opening 240, extending partially into the layer 210, is then etched in the layers 210 and 230 using conventional anisotropic etching and masking techniques as shown in FIG. 18. The etching process may etch material partially from the layer 210 thereby forming a recess in the layer 210. The opening 240 may be formed, for example, as a rectangular channel or as a substantially circular opening in the layers 210 and 230. The opening 240 is preferably formed using a conventional circular contact hole mask resulting in a substantially circular opening. The minimum lateral dimension $Y_1$ of the opening 240 may range from about 2500 to 8000 Angstroms, and preferably it will be approximately 5000 Angstroms. The opening 240 includes a generally horizontal bottom surface 250 and generally vertical side walls 260 at its outer periphery.

Figure 19:
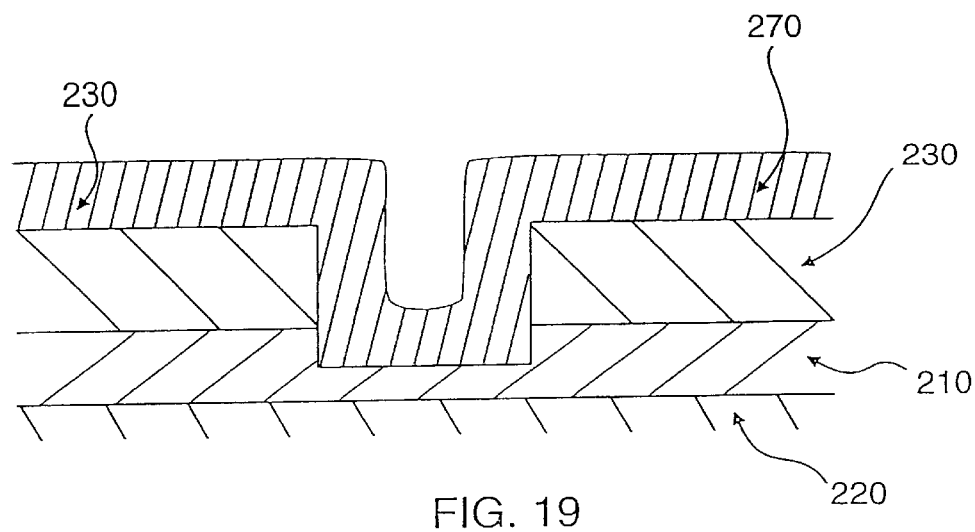
FIG. 19 is a fragmentary cross sectional view of the deposition of a second layer of polysilicon onto the first layer of polysilicon and into the opening in the layer of polysilicon and into the recess in the layer of silicon nitride of FIG. 18.
Figure 20:
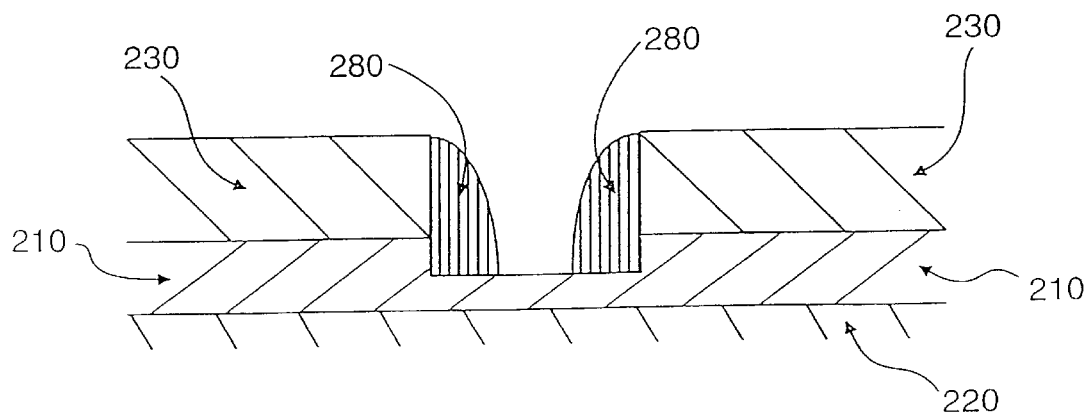
FIG. 20 is a fragmentary cross sectional view of the etching of the second layer of polysilicon of FIG. 19 to form a spacer.

A second layer 270 of polysilicon is then deposited onto the layer 230 and into the opening 240, onto the bottom surface 250 and side walls 260, using conventional thin film deposition techniques as shown in FIG. 19. The layer 270 may have a substantially uniform thickness ranging from about 500 to 3500 Angstroms, and preferably it will have a substantially uniform thickness of approximately 2000 Angstroms. The layer 270 may comprise polysilicon, TEOS oxide, or PECVD oxide, and preferably it will comprise polysilicon. The layer 270 is then etched using conventional anisotropic etching techniques to form a spacer 280 out of the layer 270 as shown in FIG. 20. The spacer 280 is positioned at the outer periphery of the opening 240 and covers the generally vertical side walls 260. The bottom of the spacer 280 will have a lateral thickness substantially equal to the selected thickness of the layer 270 provided the layer 270 conformally coats the layers 210 and 230.

Figure 21:
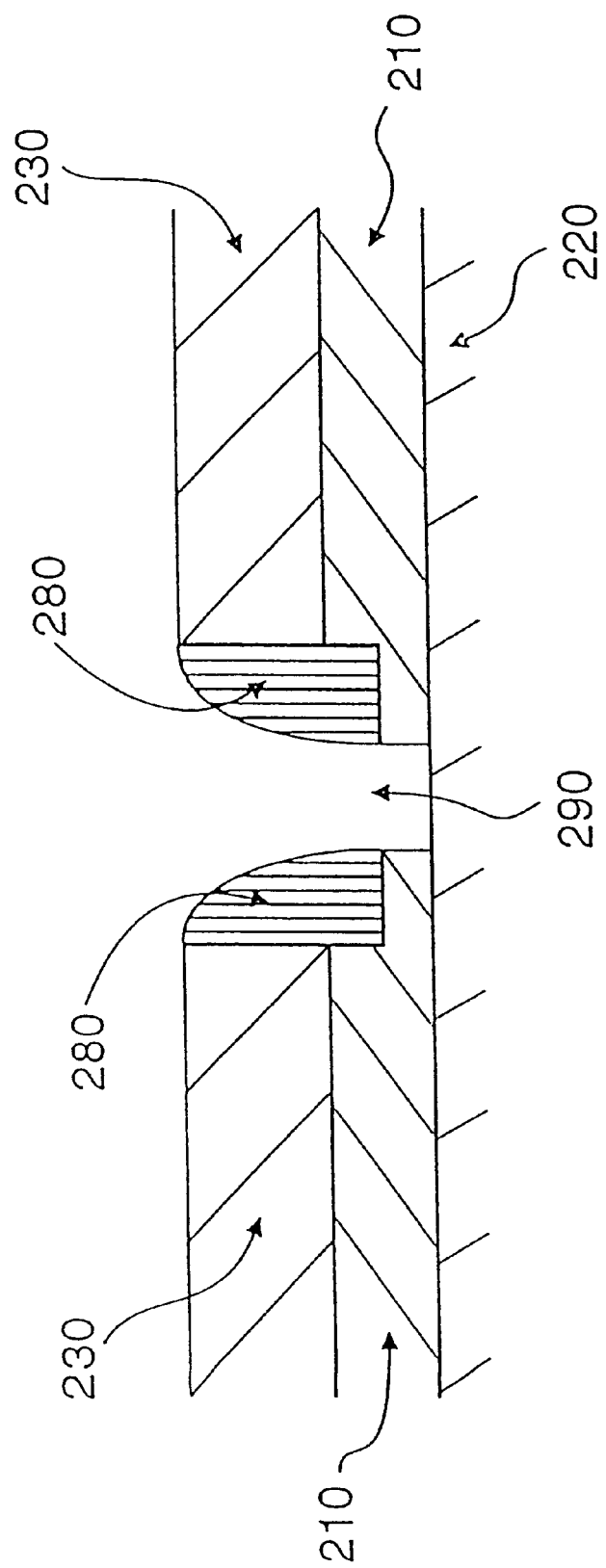
FIG. 21 is a fragmentary cross sectional view of the etching of the portions of the layer of silicon nitride circumscribed by the spacer of FIG. 20 to form an opening in the layer of silicon nitride.

The portion of the layer 210 not covered by the spacer 280 are then etched using conventional anisotropic etching techniques to form an opening 290 defining a pore in the layer 210 extending to the layer 220 as shown in FIG. 21. The resulting opening 290 may have a minimum lateral dimension ranging from about 500 to 4000 Angstroms, and preferably it will have a minimum lateral dimension of approximately 1000 Angstroms. The minimum lateral dimension of the opening 290 is defined by the selected thickness of the layer 270 used in forming the spacer 280. The spacer 280 and layer 230 may then be removed subsequent to the formation of a chalcogenide memory cell within the pore 290 as will be described hereinafter. The disposable spacer 280 thus provides a means of defining the minimum lateral dimension of an ultra-small pore in the layer 210. The second preferred embodiment of the present method thus provides a means of fabricating an ultra-small pore 290 in the layer 210 by use of a disposable spacer 280 positioned adjacent to an edge feature of the layer 230.

Note that while a range of materials may be utilized for each of the layers, the particular materials selected for each of the layers must be selected to provide proper selectivity during the various etching processes as will be recognized by persons of ordinary skill in the art.

The resulting structure illustrated in FIG. 21 includes a conductive substrate 220 and an insulative layer 210 including an opening 290. This structure is then preferably used to fabricate a chalcogenide memory cell in which the opening 290 provides a pore for placement of a chalcogenide memory cell comprising a sandwich of an upper electrode, a layer chalcogenide material, and a lower electrode.

Figure 22:
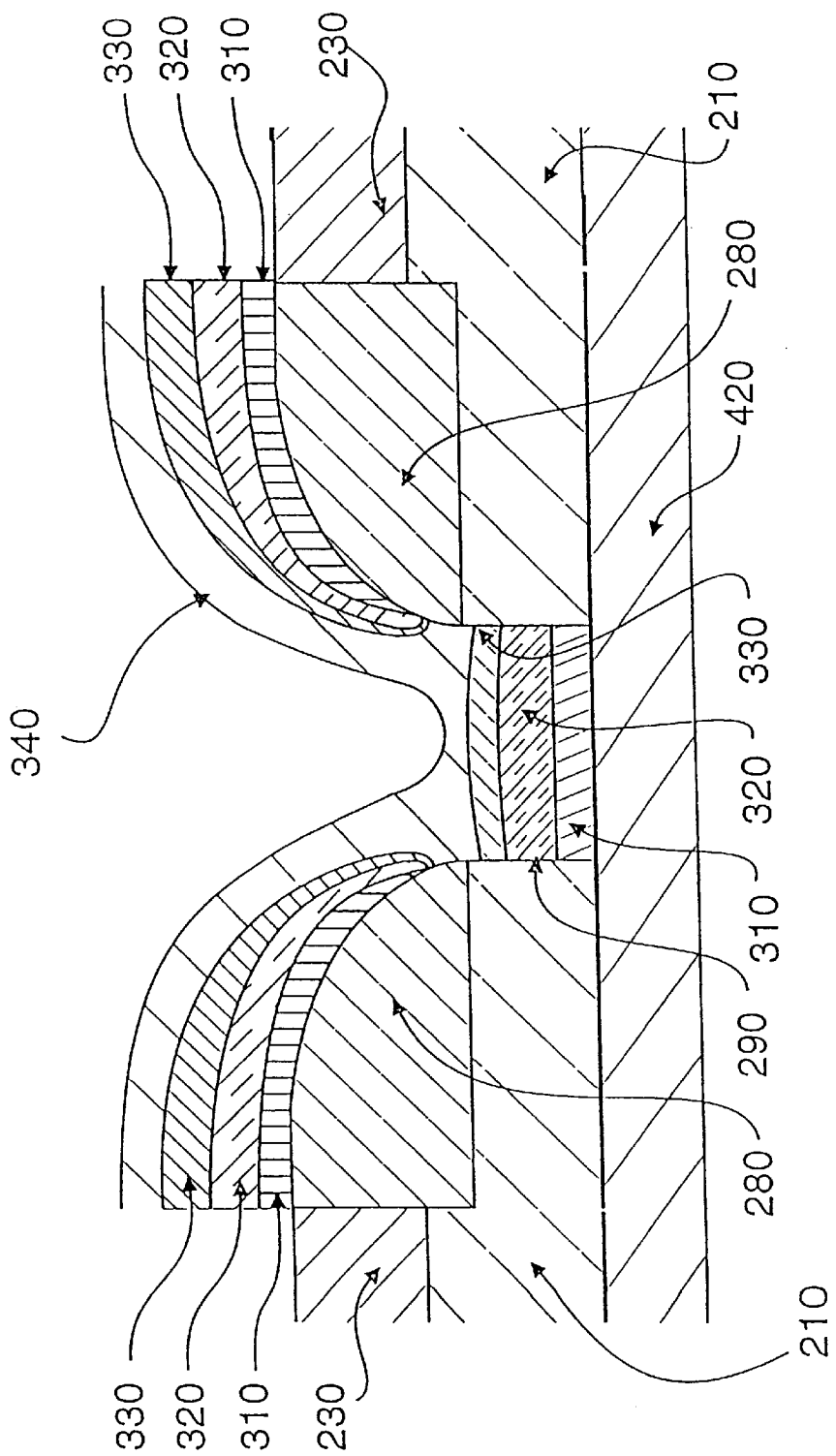
FIG. 22 is a fragmentary cross sectional view of the sequential and substantially collimated sputter deposition of carbon, chalcogenide material, and carbon followed by the deposition of silicon dioxide onto the structure of FIG. 21.

As illustrated in FIG. 22, the chalcogenide memory cell is fabricated by sequentially depositing a lower conductive layer 310 of carbon, followed by a layer 320 of chalcogenide material, and finally an upper conductive layer 330 of carbon using conventional thin film deposition techniques such as, for example, PVD. The layers 310, 320, and 330 are preferably deposited by sequential sputter deposition to provide a substantially collimated layering of the layers 310, 320, and 330 within the pore 290. The layers 310, 320, and 330 thus form the basic elements of the chalcogenide memory cell.

The layer 310 may comprise carbon, TiN, or TiW, and preferably it comprises carbon. The thickness of the layer 310 may range from approximately 100 to 1000 Angstroms, and preferably it is around 600 Angstroms.

The chalcogenide material layer 320 may range from approximately 100 to 1000 Angstroms, and preferably it is around 500 Angstroms thick. Typical chalcogenide compositions for these memory cells include average concentrations of Te in the amorphous state well below 70%, typically below about 60% and ranging in general from as low as about 23% up to about 56% Te, and most preferably to about 48% to 56% Te. Concentrations of Ge are typically above about 15% and range from a low of about 17% to about 44% average, remaining generally below 50% Ge, with the remainder of the principal constituent elements in this class being Sb. The percentages given are atomic percentages which total 100% of the atoms of the constituent elements. In a particularly preferred embodiment, the chalcogenide compositions for these memory cells comprise a Te concentration of about 55%, a Ge concentration of about 22%, and a Sb concentration of about 22%. This class of materials are typically characterized as $Te_aGe_bSb_{100-(a+b)}$, where a is equal to or less than about 70% and preferably between about 60% to about 40%, b is above about 15% and less than 50%, preferably between about 17% to about 44%, and the remainder is Sb.

The layer 330 may comprise carbon, TiN, or TiW, and preferably it comprises carbon. The thickness of the layer 330 may range from approximately 100 to 1000 Angstroms, and preferably it is around 600 Angstroms.

As illustrated in FIG. 22, following the deposition of the layers 310, 320, and 330, a protective layer 340 of silicon dioxide is deposited. The layer 340 of silicon dioxide coats the materials within the pore 290 and remains there throughout subsequent chemical mechanical polishing (CMP) operations and etching and ashing operations. As such, the layer 340 protects the layers 310, 320, and 330 within the pore 290 from attack by the chemical etchants used in these subsequent operations. The layer 340 may be deposited using conventional thin film deposition processes such as, for example, low pressure chemical vapor deposition (LPCVD), and preferably it is deposited by PECVD. The layer 340 may comprise silicon dioxide, TEOS, or $Si_3N_4$, and preferably it is TEOS. The layer 340 may range in thickness from approximately 200 to 10,000 Angstroms, and preferably it is around 5000.

Figure 23:
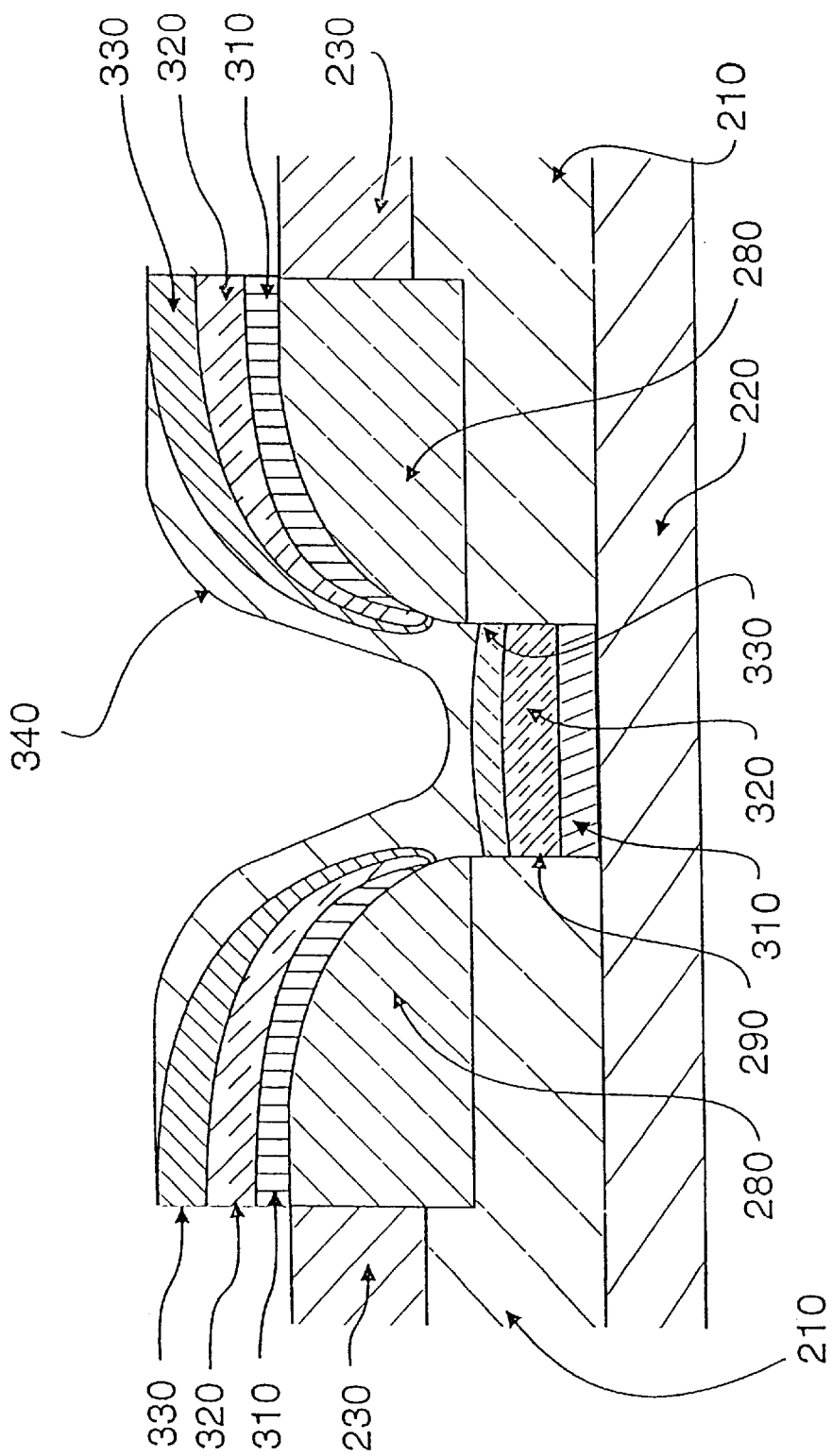
FIG. 23 is a fragmentary cross sectional view of the structure of FIG. 22 following a chemical mechanical polishing (CMP) operation to remove a portion of the silicon dioxide layer.
Figure 24:
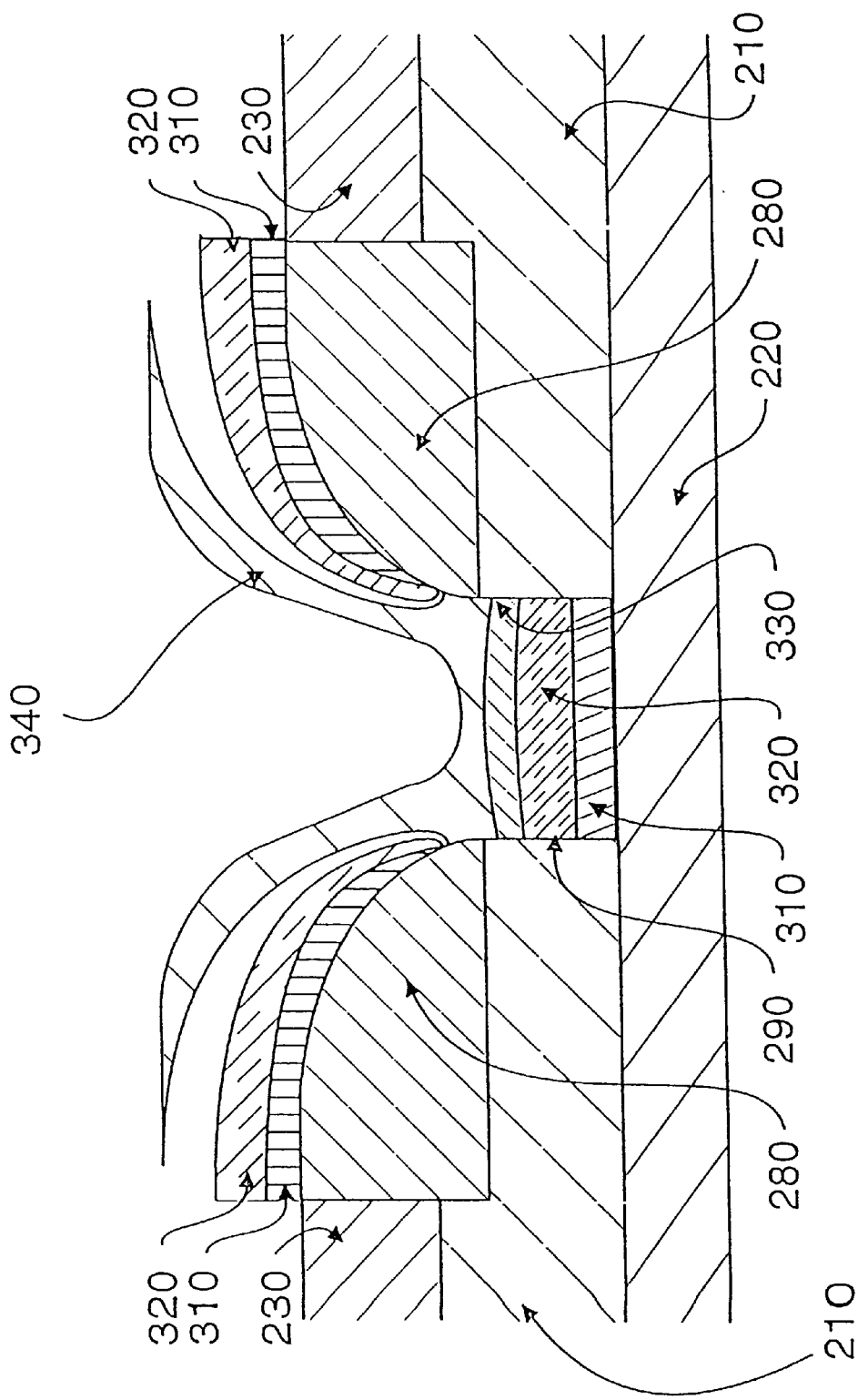
FIG. 24 is a fragmentary cross sectional view of the structure of FIG. 23 following an ashing operation to remove the upper carbon layer not covered by the silicon dioxide layer.
Figure 25:
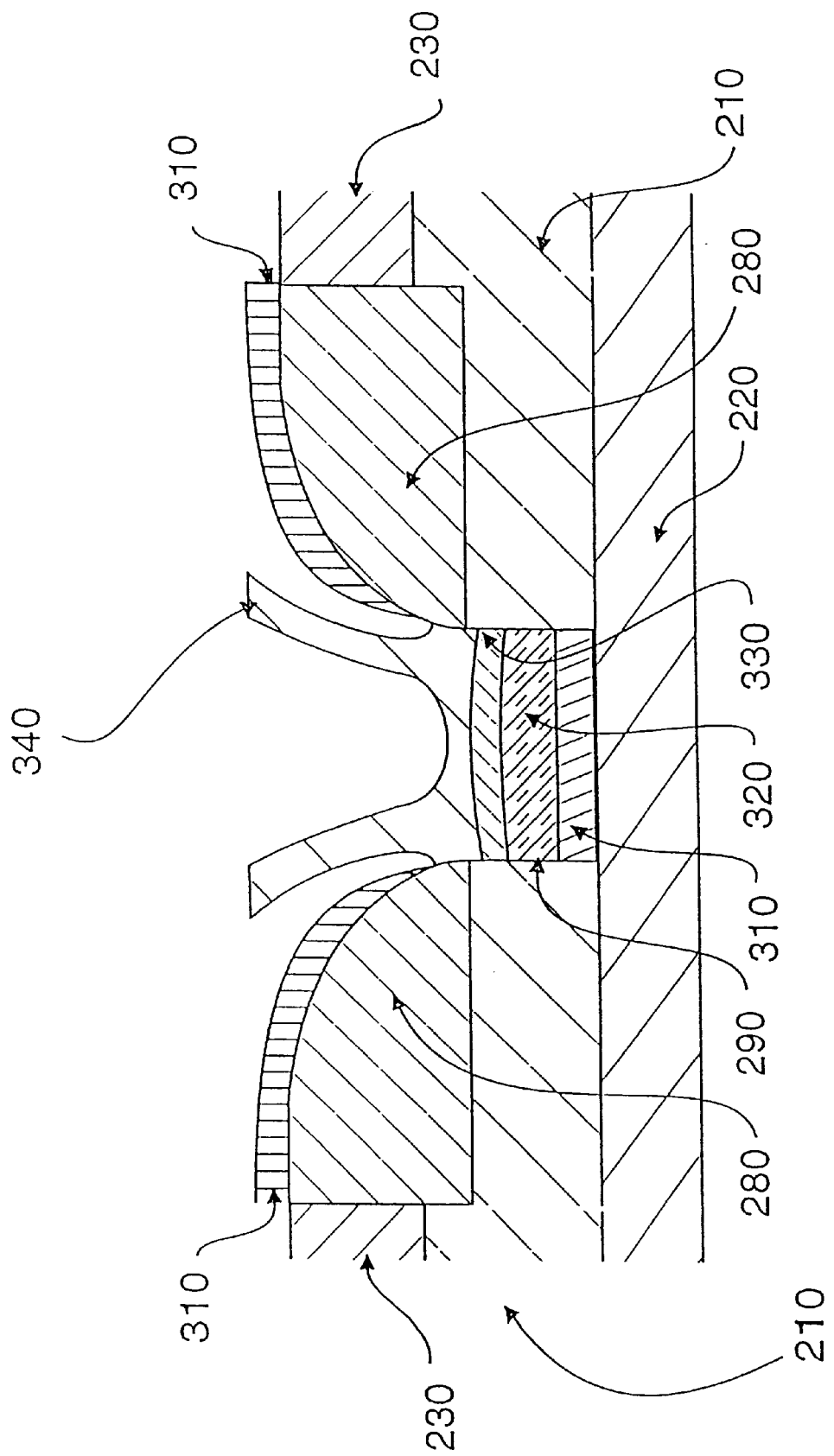
FIG. 25 is a fragmentary cross sectional view of the structure of FIG. 24 following chemical mechanical polishing (CMP) and wet etch operation to remove the chalcogenide material not covered by the silicon dioxide layer.
Figure 26:
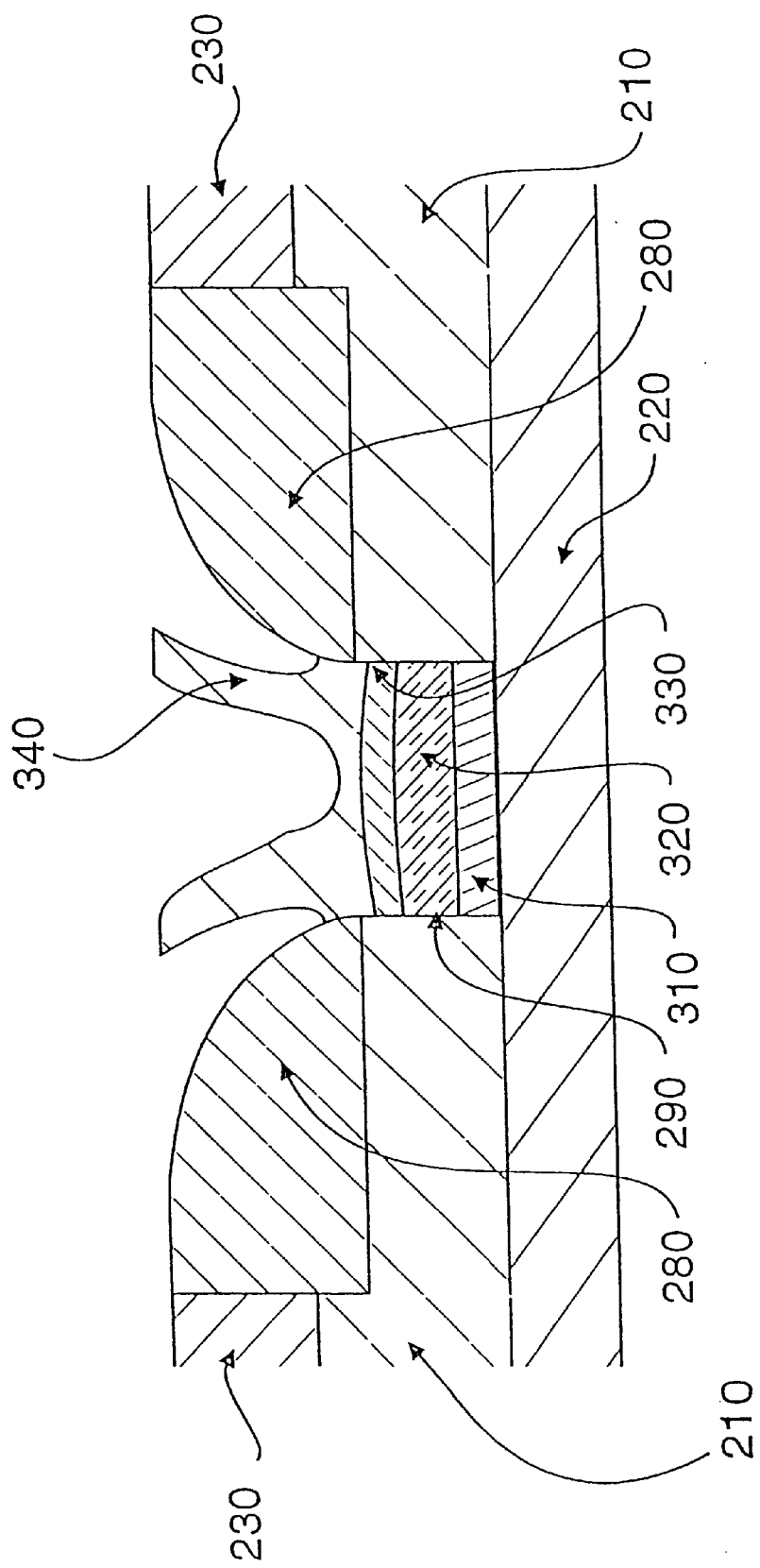
FIG. 26 is a fragmentary cross sectional view of the structure of FIG. 25 following an ashing operation to remove the lower carbon layer not covered by the silicon dioxide layer.

Referring to FIGS. 23–26, during subsequent chemical mechanical polishing (CMP) and etching operations which remove the layers 310, 320, and 330 outside of the pore 290, the layer 340 of TEOS within the pore 290 protects the layers 310, 320, and 330 within the pore 290. Referring to FIG. 23, the outermost portion of the layer 340 of TEOS may first be removed by a conventional chemical mechanical polishing (CMP) operation. The carbon layer 330 provides a CMP etch stop during the operation. Referring to FIG. 24, the uppermost carbon layer 330 may then be removed by exposure to a conventional oxygen plasma or other similar "ashing" operation. The ashing operation is preferred to a CMP operation since CMP typically does not remove carbon layers very well. Referring to FIG. 25, the chalcogenide layer 320 may then be removed by a conventional chemical mechanical polishing (CMP) operation, but preferably it is removed by a combination of CMP and a conventional wet etch process including an etch stop on the carbon layer 310. In this manner, residue of the chalcogenide layer 320 is removed that would not be removed by CMP processing alone. Referring to FIG. 26, the lower carbon layer 310 may then be removed by a conventional "ashing" operation. Note that throughout the CMP and/or etching operations illustrated in FIGS. 23–26, the remaining portion of the layer 340 of TEOS protects the materials within the pore 290.

Figure 27:
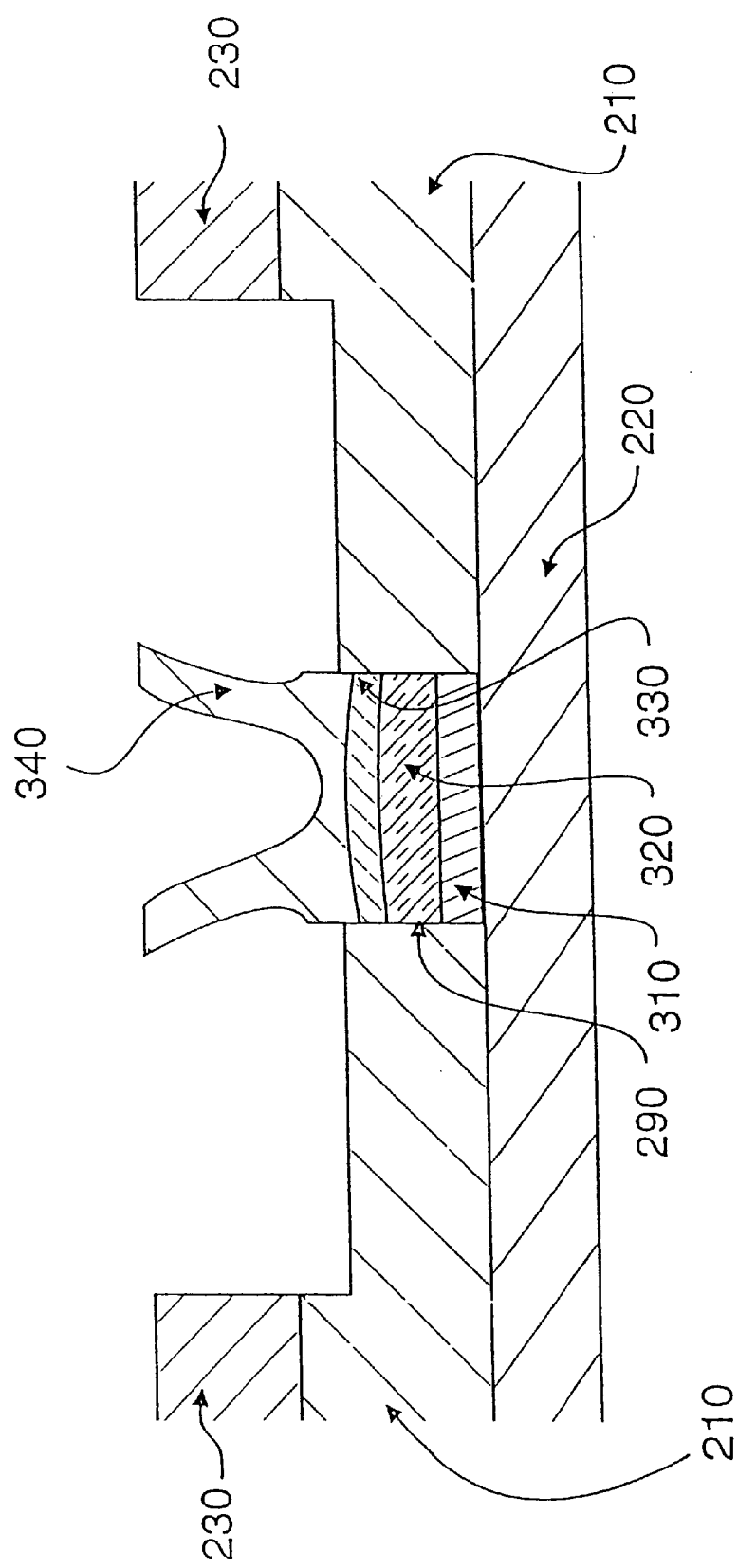
FIG. 27 is a fragmentary cross sectional view of the structure of FIG. 26 following a wet etch process to remove the disposable polysilicon spacer.
Figure 28:
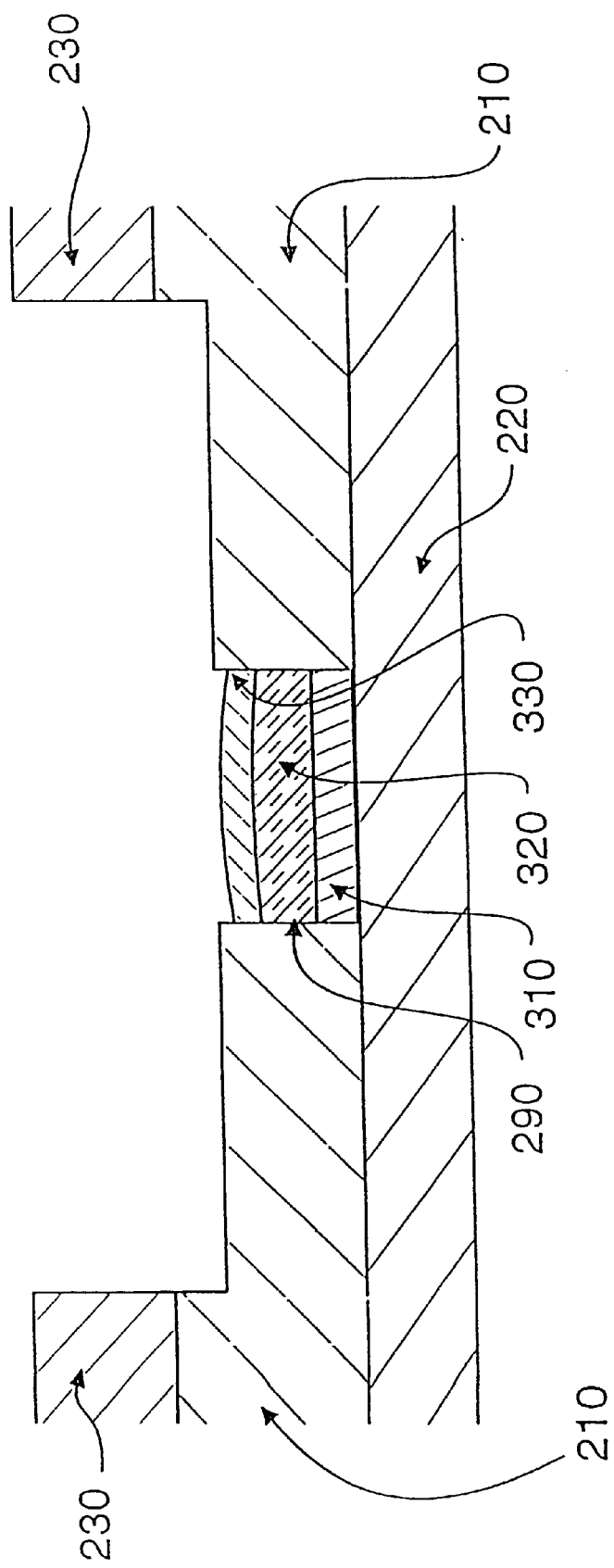
FIG. 28 is a fragmentary cross sectional view of the structure of FIG. 27 following a wet etch process to remove the remaining portion of the layer of silicon dioxide.
Figure 29:
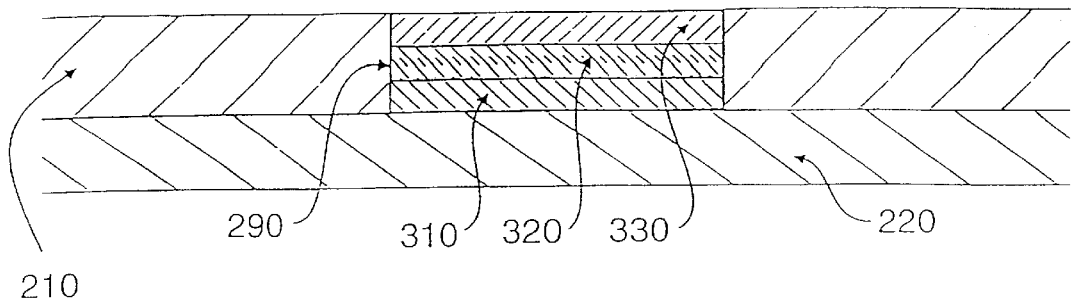
FIG. 29 is a fragmentary cross sectional view of the structure of FIG. 28 following a chemical mechanical polishing (CMP) operation.

Referring to FIG. 27, the disposable spacer 280 of polysilicon may now be removed using a conventional wet etch process using, for example, $NH_4OH$. The remaining portion of the layer 340 of TEOS also protects the materials within the pore 290 during this operation. Finally, referring to FIG. 28, the remaining portion of the layer 340 of TEOS may be removed using a conventional oxide wet etch process. In preparation for the final processing steps, the structure illustrated in FIG. 28 may then be subjected to a conventional chemical mechanical polishing (CMP) operation as shown in FIG. 29 to provide a substantially planar topography.

Figure 30:
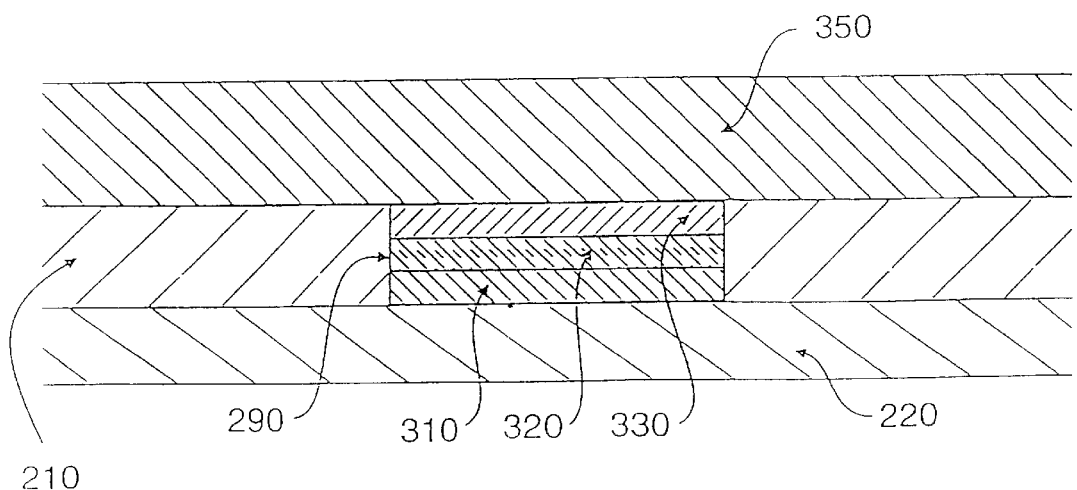
FIG. 30 is a fragmentary cross sectional view of the structure of FIG. 29 following the deposition of a layer of silicon dioxide.
Figure 31:
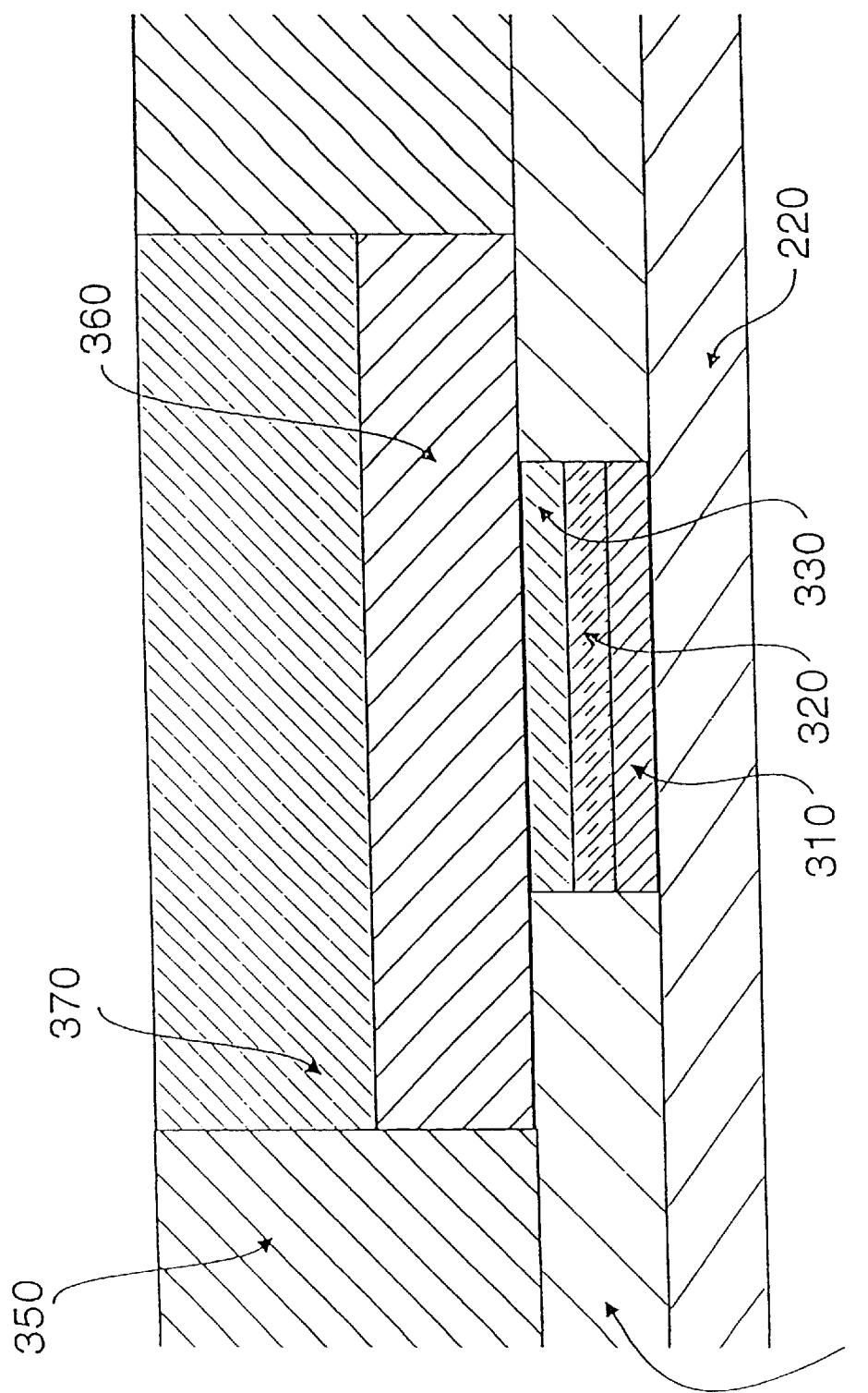
FIG. 31 is a fragmentary cross sectional view of the structure of FIG. 30 following a masking and etching operation to expose the upper layer of carbon followed by the successive deposition of a TiN barrier metal layer and an aluminum metalization layer.

The remaining processing steps illustrated in FIGS. 30 and 31 permit electrical connection of the chalcogenide memory cell within the pore 290 to a conductive upper grid. As illustrated in FIG. 30, an insulating layer 350 of silicon dioxide may then be deposited using conventional thin film deposition methods. The layer 350 may then be masked and etched using conventional methods to provide access to the upper layer 330 of carbon within the pore 290. A conductive layer 360 of a barrier metal such as, for example, TiN is then deposited using conventional thin film deposition methods. The conductive layer 360 may comprise a conductive material such as, for example, TiN, TiW, or TiAl, and preferably it comprises TiN. The layer 360 may range in thickness from approximately 100 to 2000 Angstroms, and preferably it is 500 Angstroms in thickness. A conductive layer 370 of aluminum may then be applied using conventional metallization processes. The conductive layer 370 preferably comprises an upper conductive grid for an array of chalcogenide memories. The conductive layer 370 may comprise a conductive material such as, for example, aluminum alloy, TiW, or CVD W on TiN, and preferably it comprises Al/Cu. The conductive layer 370 may range in thickness from approximately 100 to 10,000 Angstroms, and preferably it is 7500 Angstroms in thickness.

In a particularly preferred embodiment, the methods described are utilized to form an array of chalcogenide memory cells which are addressable by an X-Y grid of upper and lower conductors. In the particularly preferred embodiment, diodes are further provided in series with the chalcogenide memories in order to permit read/write operations from/to individual chalcogenide memory cells as will be recognized by persons of ordinary skill in the art.

Figure 32:
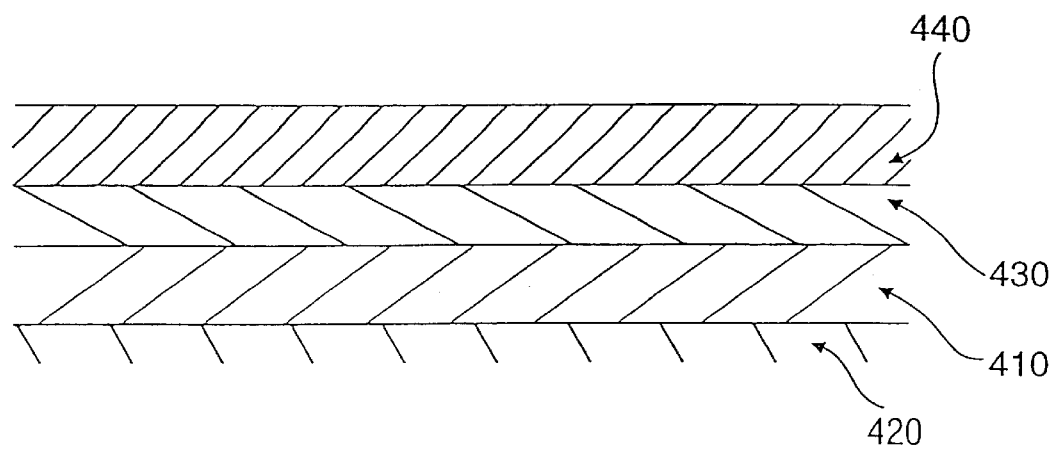
FIG. 32 is a fragmentary cross sectional view of the deposition of layers of silicon nitride, silicon dioxide, and polysilicon onto a substrate of titanium nitride in accordance with a third preferred embodiment of the present invention.

Referring to FIGS. 32 to 46, a third preferred embodiment of a method of fabricating ultra-small pores will now be described. A layer 410 of silicon nitride is first deposited onto a substrate 420 of titanium nitride. Layers 430 of silicon dioxide and 440 of polysilicon are then successively deposited onto the layer 410. In an alternative embodiment, layer 430 is not deposited. The layers 410, 430, and 440 are deposited using conventional thin film deposition techniques as shown in FIG. 32. The layer 410 may have a substantially uniform thickness ranging from about 100 to 1000 Angstroms, and preferably it will have a substantially uniform thickness of approximately 500 Angstroms. The layer 410 may be comprised of a dielectric material such as, for example, silicon nitride, TEOS oxide, or PECVD oxide, and preferably it will be comprised of silicon nitride. The layer 430 may have a substantially uniform thickness ranging from about 100 to 1500 Angstroms, and preferably it will have a substantially uniform thickness of approximately 700 Angstroms. The layer 430 may be comprised of TEOS oxide or PECVD oxide, and preferably it will be comprised of TEOS oxide. The layer 440 may have a substantially uniform thickness ranging from about 1000 to 6000 Angstroms, and preferably it will have a substantially uniform thickness of approximately 4000 Angstroms. The layer 440 may be comprised of polysilicon, TEOS oxide, or PECVD oxide, and preferably will be comprised of polysilicon. The substrate 420 may be comprised of a conductive material such as, for example, TiN, carbon, $WSi_x$, or TiW, and preferably will be comprised of TiN. In a preferred embodiment, the substrate layer 420 will comprise a conductive lower grid for accessing an array of chalcogenide memory cells.

Figure 33:
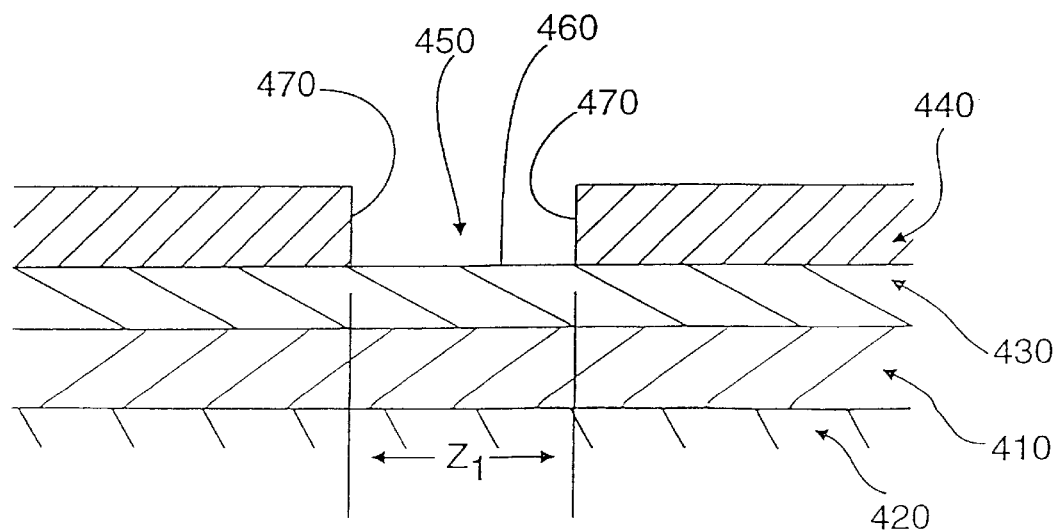
FIG. 33 is a fragmentary cross sectional view of the formation of an opening in the layer of polysilicon of FIG. 32.

An opening 450, extending downward to the layer 430, is then etched in the layer 440 using conventional anisotropic etching and masking techniques as shown in FIG. 33. The composition of the layer 430 is selected to prevent any material within the layer 410 from being etched away by this process. The opening 450 may be formed, for example, as a rectangular channel or as a substantially circular opening in the layer 440. The opening 450 is preferably formed using a conventional contact hole mask resulting in a substantially circular opening. The minimum lateral dimension $z_1$ of the opening 450 may range from about 2500 to 8000 Angstroms, and preferably it will be approximately 5000 Angstroms. The opening 450 includes a generally horizontal bottom surface 460 and generally vertical side walls 470 at its outer periphery.

Figure 34:
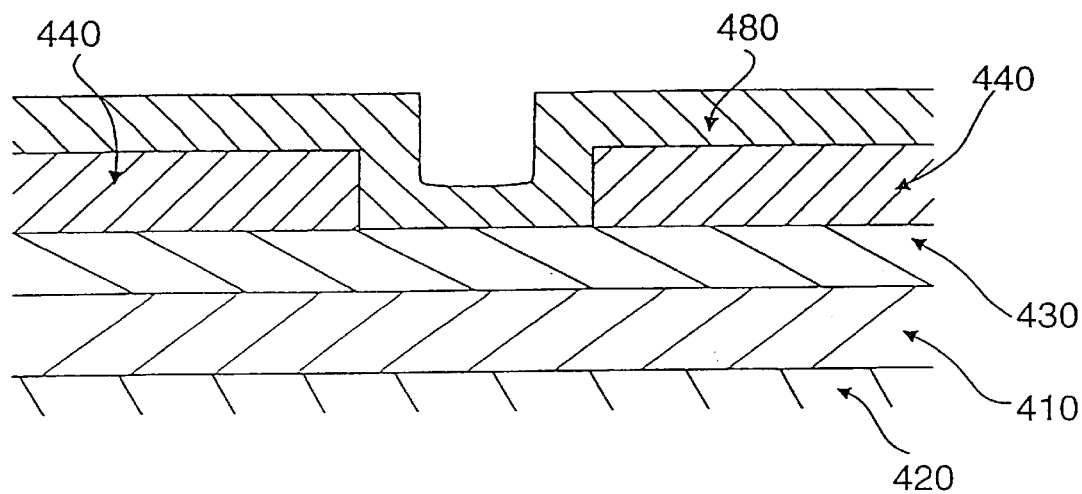
FIG. 34 is a fragmentary cross sectional view of the deposition of a second layer of polysilicon onto the first layer of polysilicon and into the opening in the first layer of polysilicon of FIG. 33.
Figure 35:
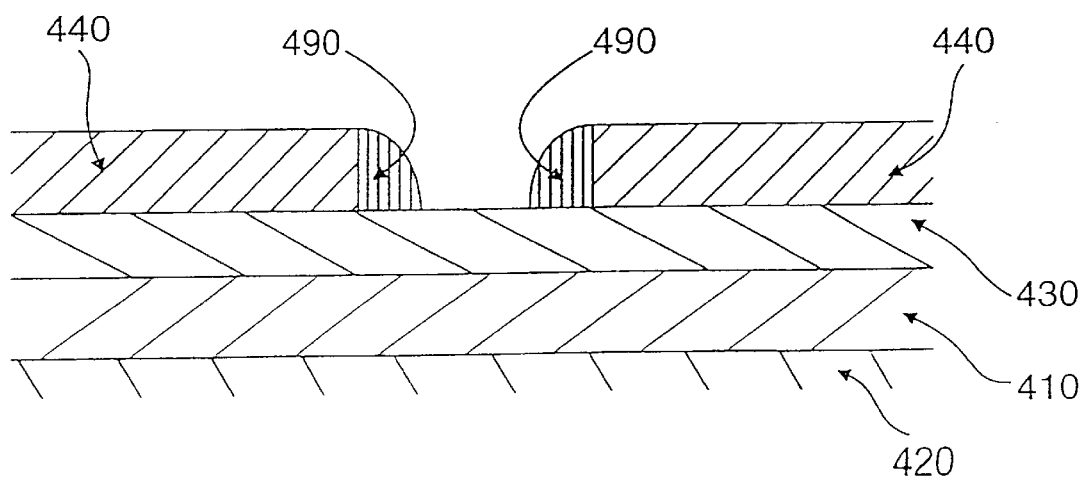
FIG. 35 is a fragmentary cross sectional view of the etching of the e second layer of polysilicon of FIG. 34 to form a spacer.

A second layer 480 of polysilicon is then deposited onto the layer 440 and into the opening 450, onto the bottom surface 460 and side walls 470, using conventional thin film deposition techniques as shown in FIG. 34. The layer 480 may have a substantially uniform thickness ranging from about 500 to 3500 Angstroms, and preferably it will have a substantially uniform thickness of approximately 2000 Angstroms. The layer 480 may comprise polysilicon, TEOS oxide, or PECVD oxide, and preferably it will comprise polysilicon. The layer 480 is then etched using conventional anisotropic etching techniques to form a spacer 490 out of the layer 480 as shown in FIG. 35. The spacer 490 is positioned at the outer periphery of the opening 450 and covers the generally vertical side walls 470. The bottom of the spacer 490 will have a lateral thickness substantially equal to the selected thickness of the layer 480 provided that the layer 480 conformally coats the layer 440.

Figure 36:
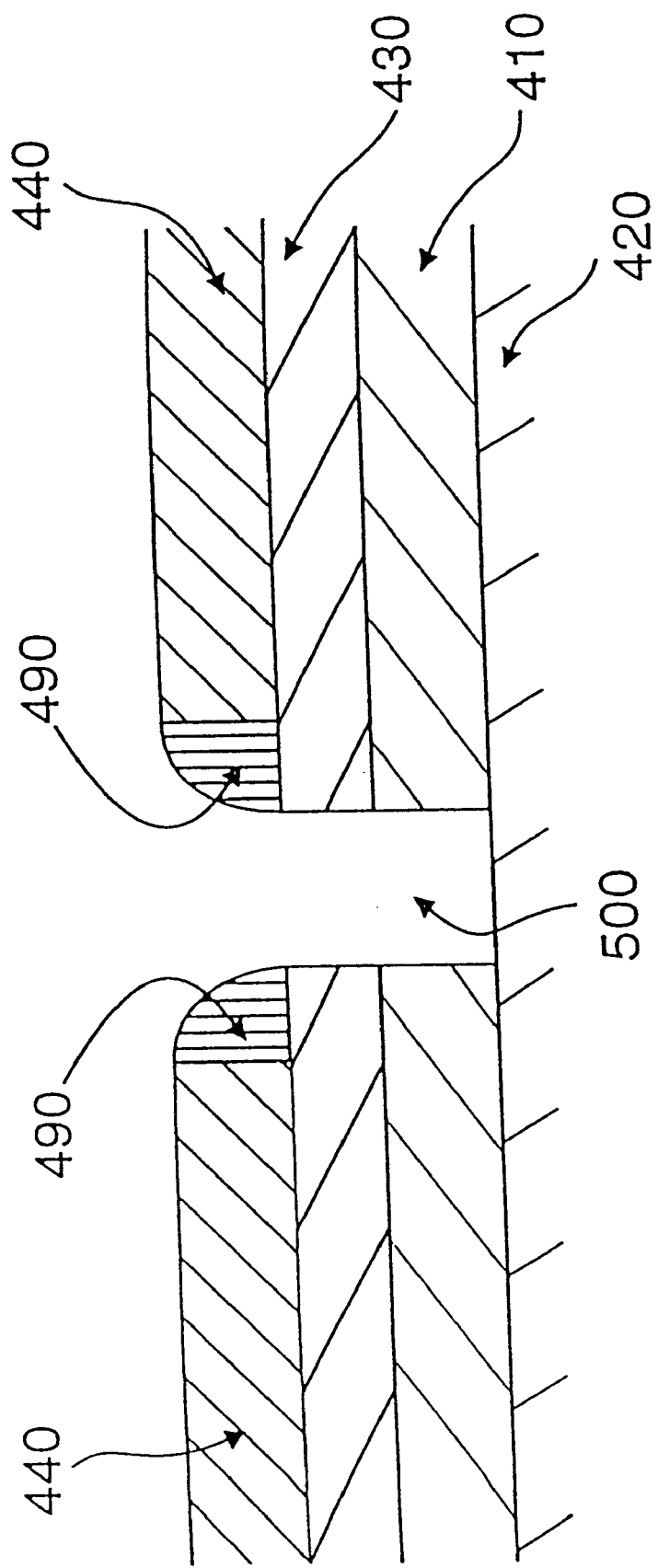
FIG. 36 is a fragmentary cross sectional view of the etching of the portions of the layers of silicon nitride and silicon dioxide circumscribed by the spacer of FIG. 35 to form an opening in the layers of silicon nitride and silicon dioxide.

The portions of the layers 410 and 430 not covered by the spacer 490 are then etched using conventional anisotropic etching techniques to form an opening 500 defining a pore in the layers 410 and 430 extending to the layer 420 as shown in FIG. 36. The resulting opening 500 may have a minimum lateral dimension ranging from about 500 to 4000 Angstroms, and preferably it will have a minimum lateral dimension of approximately 1000 Angstroms. The minimum lateral dimension of the opening 500 is defined by the selected thickness of the layer 480. The spacer 490, layer 440, and layer 430 are then removed using conventional etching techniques as shown in FIGS. 25 and 26. The disposable spacer 490 thus provides a means of defining an ultra-small pore in the layers 410 and 430. The third preferred embodiment of the present method thus provides a means of fabricating an ultra-small pore 500 in the layers 410 and 430 by use of the disposable spacer 490 positioned adjacent to an edge feature of the layer 440.

Note that while a range of materials may be utilized for each of the layers, the particular materials selected for each of the layers must be selected to provide proper selectivity during the various etching processes.

The resulting structure illustrated in FIG. 36 includes a conductive substrate 420 and insulative layers 410 and 430 including an opening 500. This structure is then preferably used to fabricate a chalcogenide memory cell in which the opening 500 provides a pore for placement of a chalcogenide memory cell comprising a sandwich of an upper electrode, a layer chalcogenide material, and a lower electrode.

Figure 37:
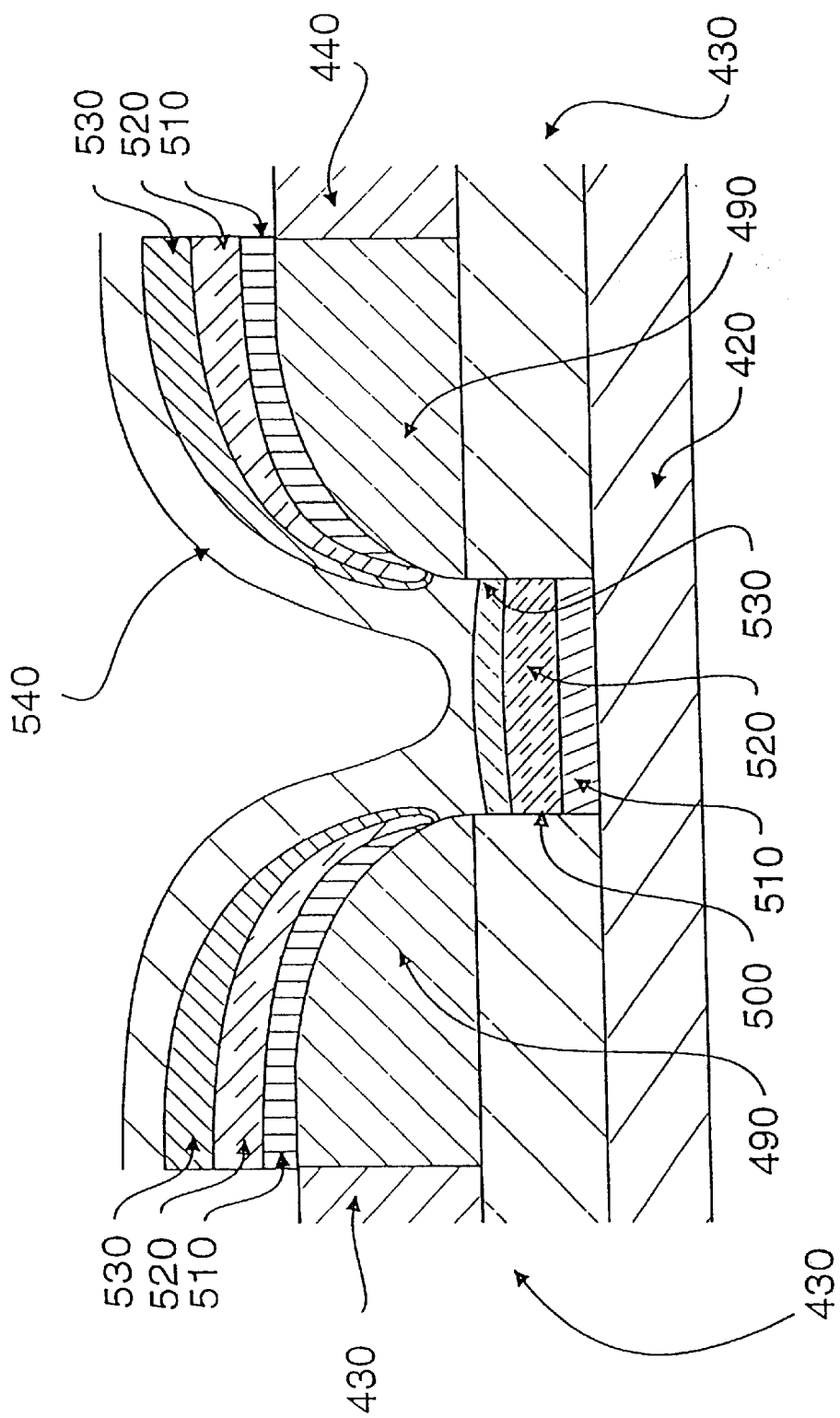
FIG. 37 is a fragmentary cross sectional view of the sequential and substantially collimated sputter deposition of carbon, chalcogenide material, and carbon followed by the deposition of silicon dioxide onto the structure of FIG. 36.

As illustrated in FIG. 37, the chalcogenide memory cell is fabricated by sequentially depositing a lower conductive layer 510 of carbon, followed by a layer 520 of chalcogenide material, and finally an upper conductive layer 530 of carbon using conventional thin film deposition techniques such as, for example, PVD. The layers 510, 520, and 530 are preferably deposited by sequential sputter deposition to provide a substantially collimated layering of the layers 510, 520, and 530 within the pore 500. The layers 510, 520, and 530 thus form the basic elements of the chalcogenide memory cell.

The layer 510 may comprise carbon, TiN, or TiW, and preferably it comprises carbon. The thickness of the layer 510 may range from approximately 100 to 1000 Angstroms, and preferably it is around 600 Angstroms.

The chalcogenide material layer 520 may range from approximately 100 to 1000 Angstroms, and preferably it is around 500 Angstroms thick. Typical chalcogenide compositions for these memory cells include average concentrations of Te in the amorphous state well below 70%, typically below about 60% and ranging in general from as low as about 23% up to about 56% Te, and most preferably to about 48% to 56% Te. Concentrations of Ge are typically above about 15% and range from a low of about 17% to about 44% average, remaining generally below 50% Ge, with the remainder of the principal constituent elements in this class being Sb. The percentages given are atomic percentages which total 100% of the atoms of the constituent elements. In a particularly preferred embodiment, the chalcogenide compositions for these memory cells comprise a Te concentration of about 55%, a Ge concentration of about 22%, and a Sb concentration of about 22%. This class of materials are typically characterized as $Te_aGe_bSb_{100-(a+b)}$, where a is equal to or less than about 70% and preferably between about 60% to about 40%, b is above about 15% and less than 50%, preferably between about 17% to about 44%, and the remainder is Sb.

The layer 530 may comprise carbon, TiN, or TiW, and preferably it comprises carbon. The thickness of the layer 530 may range from approximately 100 to 1000 Angstroms, and preferably it is around 1000 Angstroms.

As illustrated in FIG. 37, following the deposition of the layers 510, 520, and 530, a protective layer 540 of TEOS is deposited. The layer 540 of TEOS coats the materials within the pore 500 and remains there throughout subsequent chemical mechanical polishing (CMP) operations and etching and ashing operations. As such, the layer 540 protects the layers 510, 520, and 530 within the pore 500 from attack by the chemical etchants used in these subsequent operations. The layer 540 may be deposited using conventional thin film deposition processes such as, for example, low pressure chemical vapor deposition (LPCVD), and preferably it is deposited by PECVD. The layer 540 may comprise silicon dioxide, TEOS, or $Si_3N_4$, and preferably it is comprised of TEOS. The layer 540 may range in thickness from approximately 200 to 10,000 Angstroms, and preferably it is around 5000 Angstroms in thickness.

Figure 38:
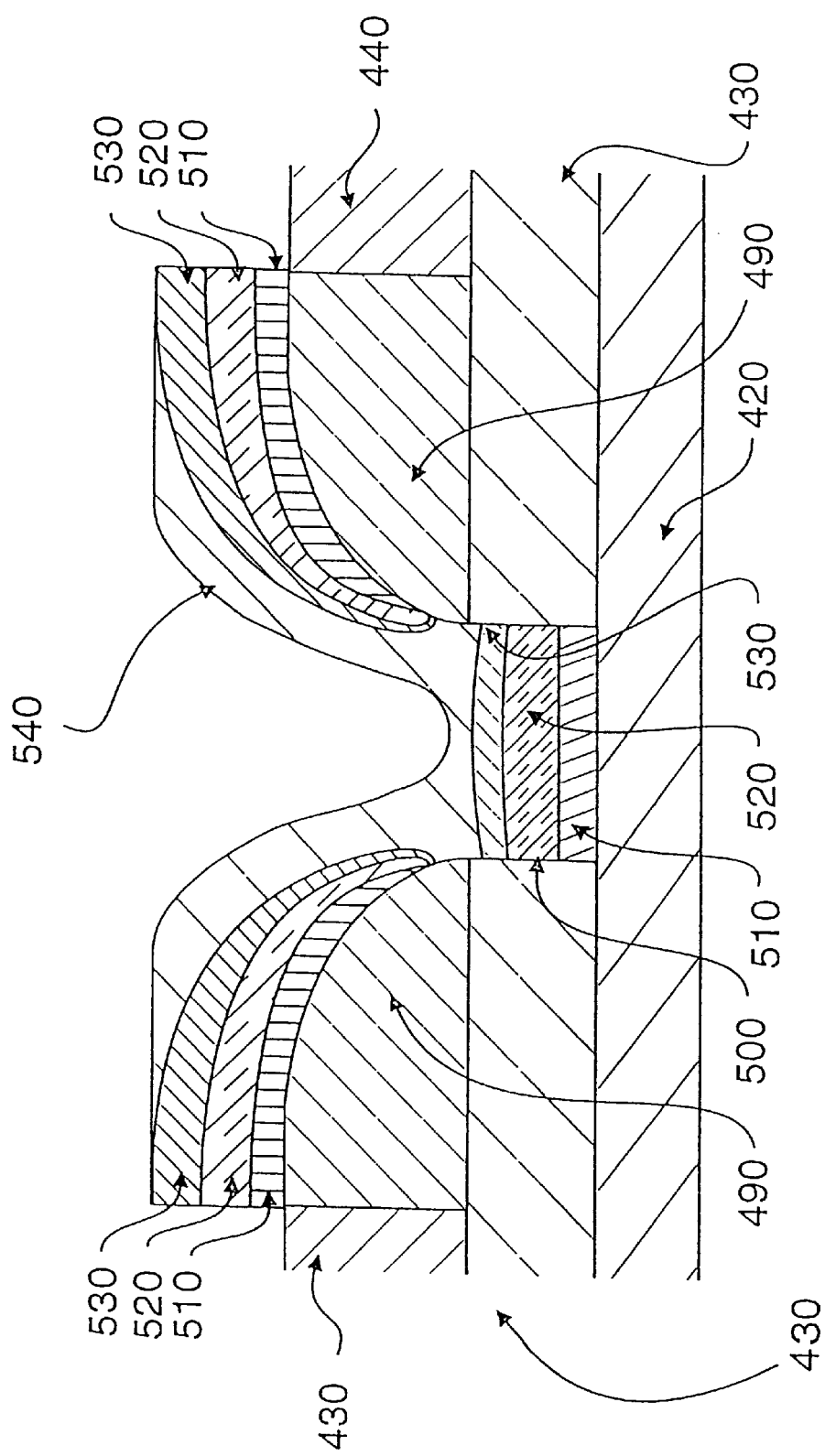
FIG. 38 is a fragmentary cross sectional view of the structure of FIG. 37 following a chemical mechanical polishing (CMP) operation to remove a portion of the silicon dioxide layer.
Figure 39:
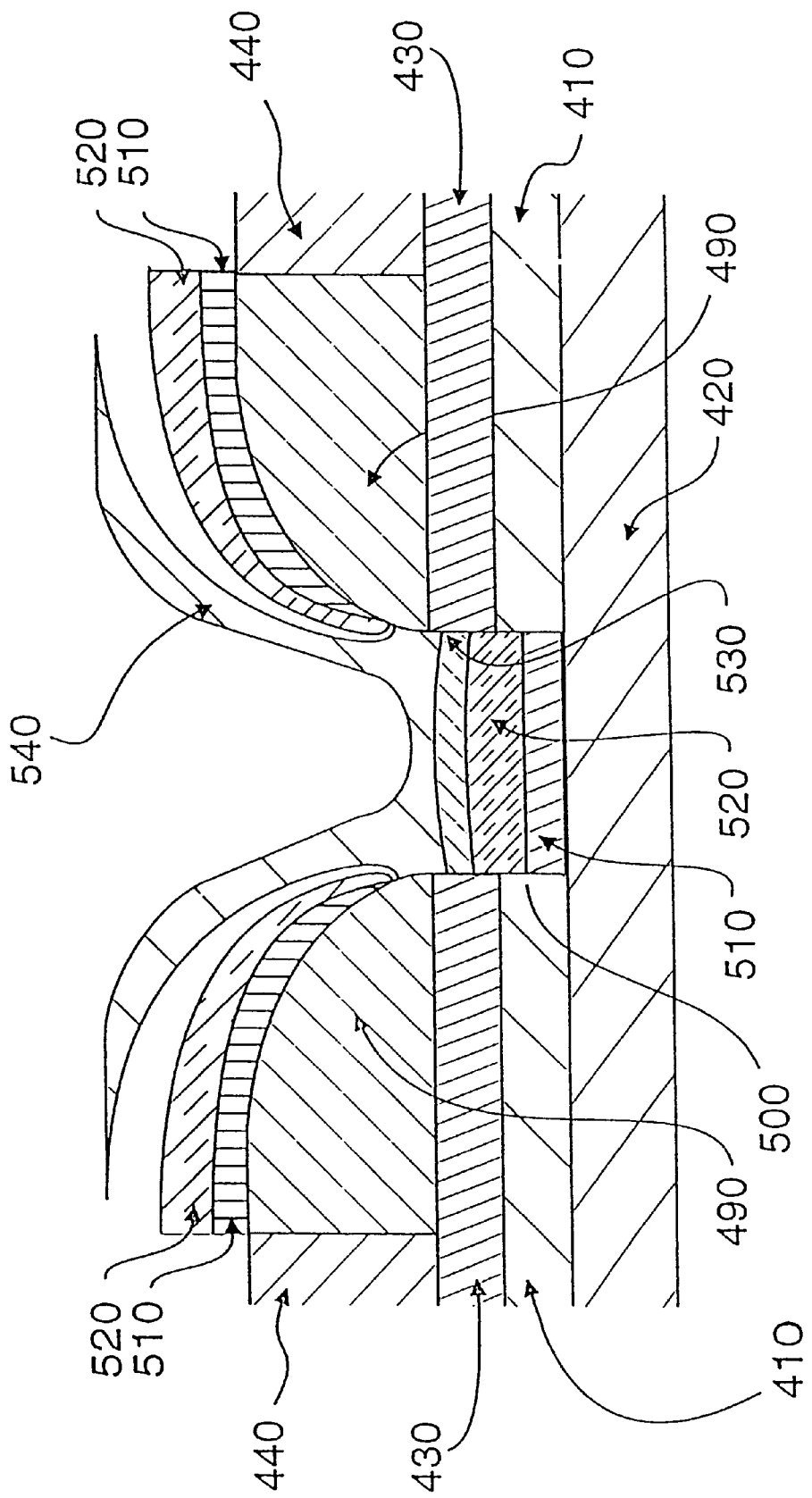
FIG. 39 is a fragmentary cross sectional view of the structure of FIG. 38 following an ashing operation to remove the upper carbon layer not covered by the silicon dioxide layer.
Figure 40:
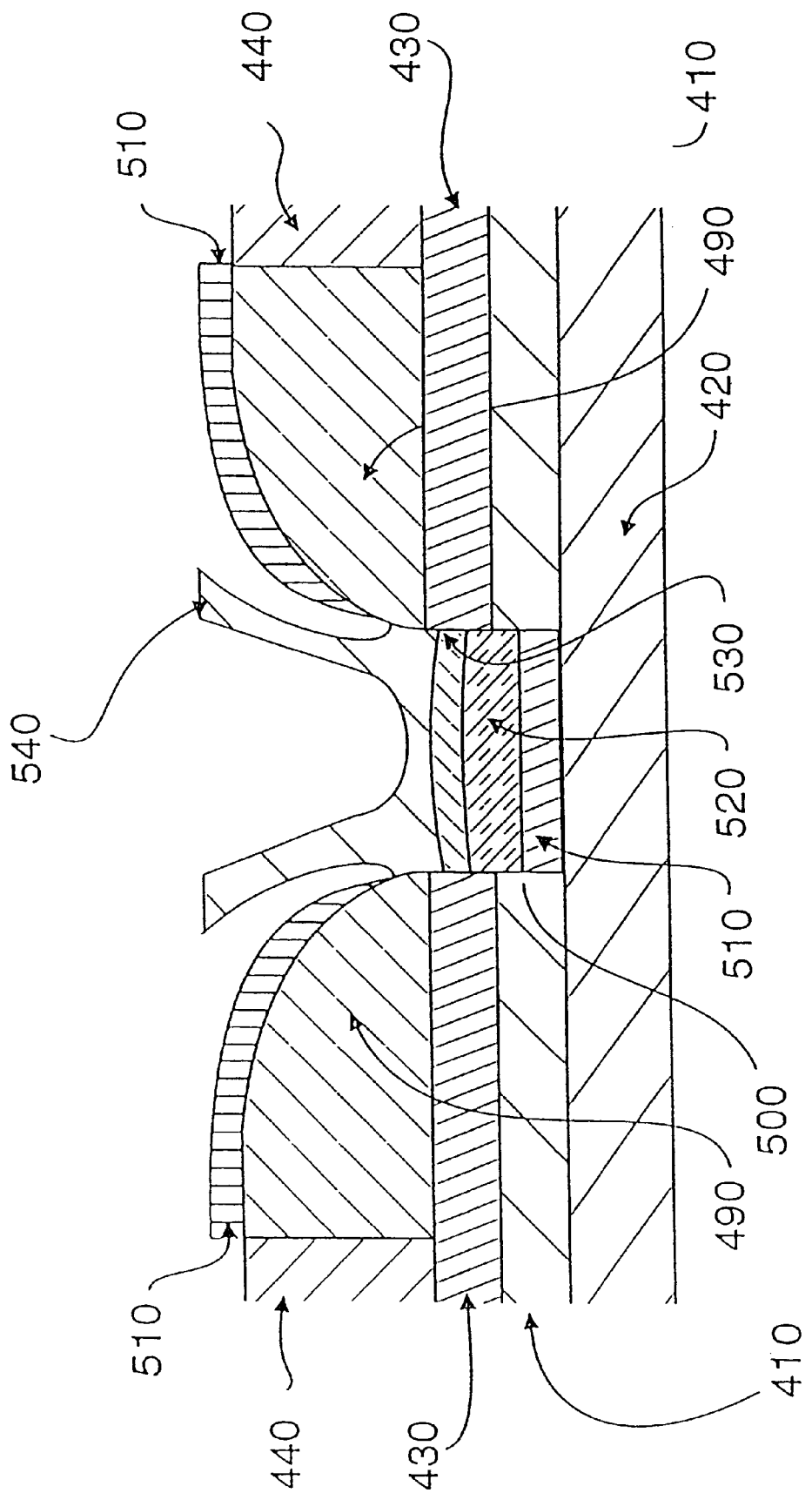
FIG. 40 is a fragmentary cross sectional view of the structure of FIG. 39 following chemical mechanical polishing (CMP) and wet etch operation to remove the chalcogenide material not covered by the silicon dioxide layer.
Figure 41:
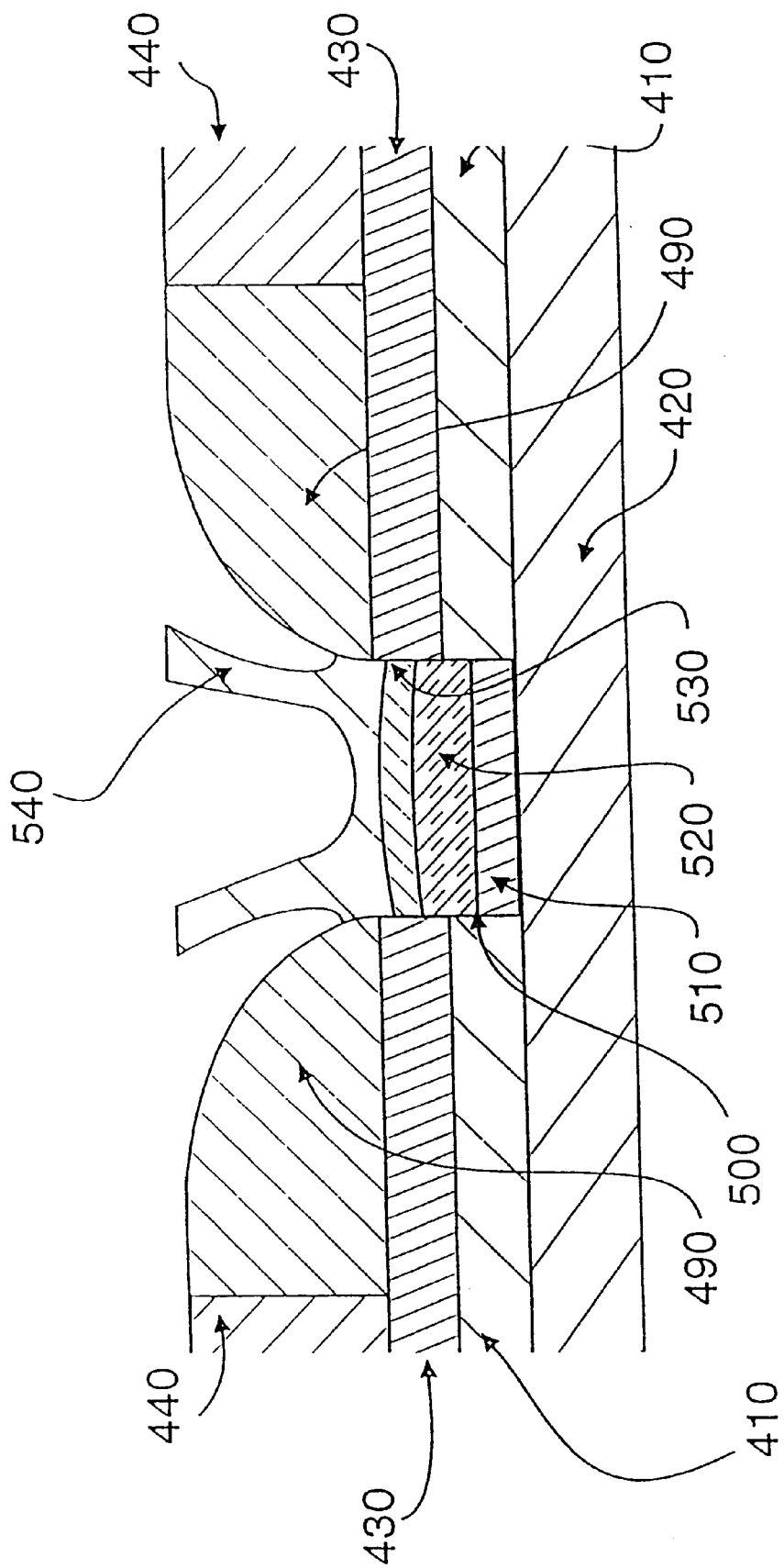
FIG. 41 is a fragmentary cross sectional view of the structure of FIG. 40 following an ashing operation to remove the lower carbon layer not covered by the silicon dioxide layer.

Referring to FIGS. 38–41, during subsequent chemical mechanical polishing (CMP) and etching operations which remove the layers 510, 520, and 530 outside of the pore 500, the layer 540 of TEOS within the pore 500 protects the layers 510, 520, and 530 within the pore 500. Referring to FIG. 38, the outermost portion of the layer 540 of TEOS may first be removed by a conventional chemical mechanical polishing (CMP) operation. The uppermost carbon layer 530 provides a CMP etch stop during the operation. Referring to FIG. 39, the uppermost carbon layer 530 may then be removed by exposure to a conventional oxygen plasma or other similar "ashing" operation. The ashing operation is preferred to a CMP operation since CMP typically does not remove carbon layers very well. Referring to FIG. 40, the chalcogenide layer 520 may then be removed by a conventional chemical mechanical polishing (CMP) operation, but preferably it is removed by a combination of CMP and a conventional wet etch process including an etch stop on the lower carbon layer 510. In this manner, residue of the chalcogenide layer 520 is removed that would not be removed by CMP processing alone. Referring to FIG. 41, the lower carbon layer 510 may then be removed by a conventional "ashing" operation. Note that throughout the CMP and/or etching operations illustrated in FIGS. 38–41, the remaining portion of the layer 540 of TEOS protects the materials within the pore 500.

Figure 42:
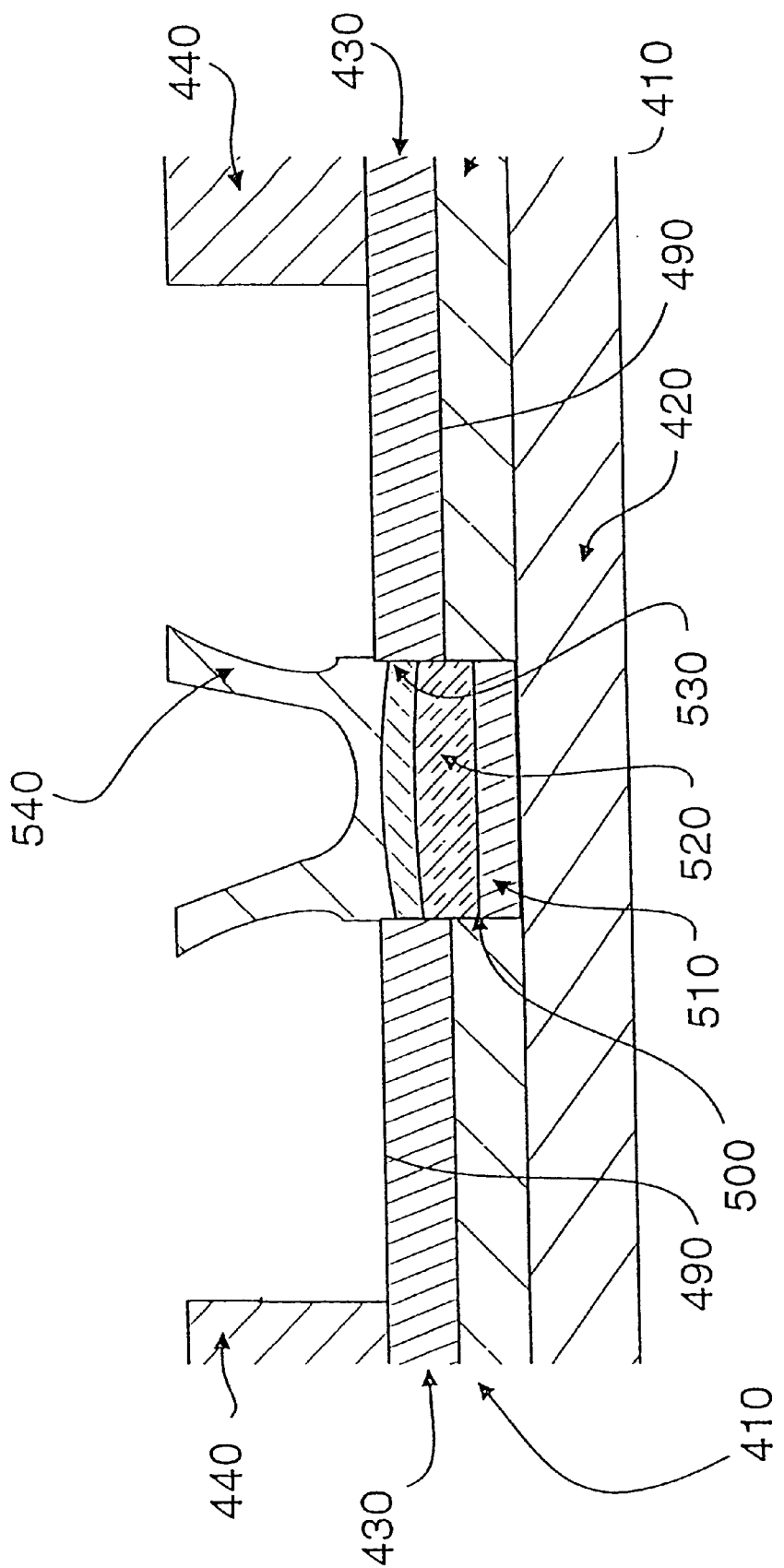
FIG. 42 is a fragmentary cross sectional view of the structure of FIG. 41 following a wet etch process to remove the disposable polysilicon spacer.
Figure 43:
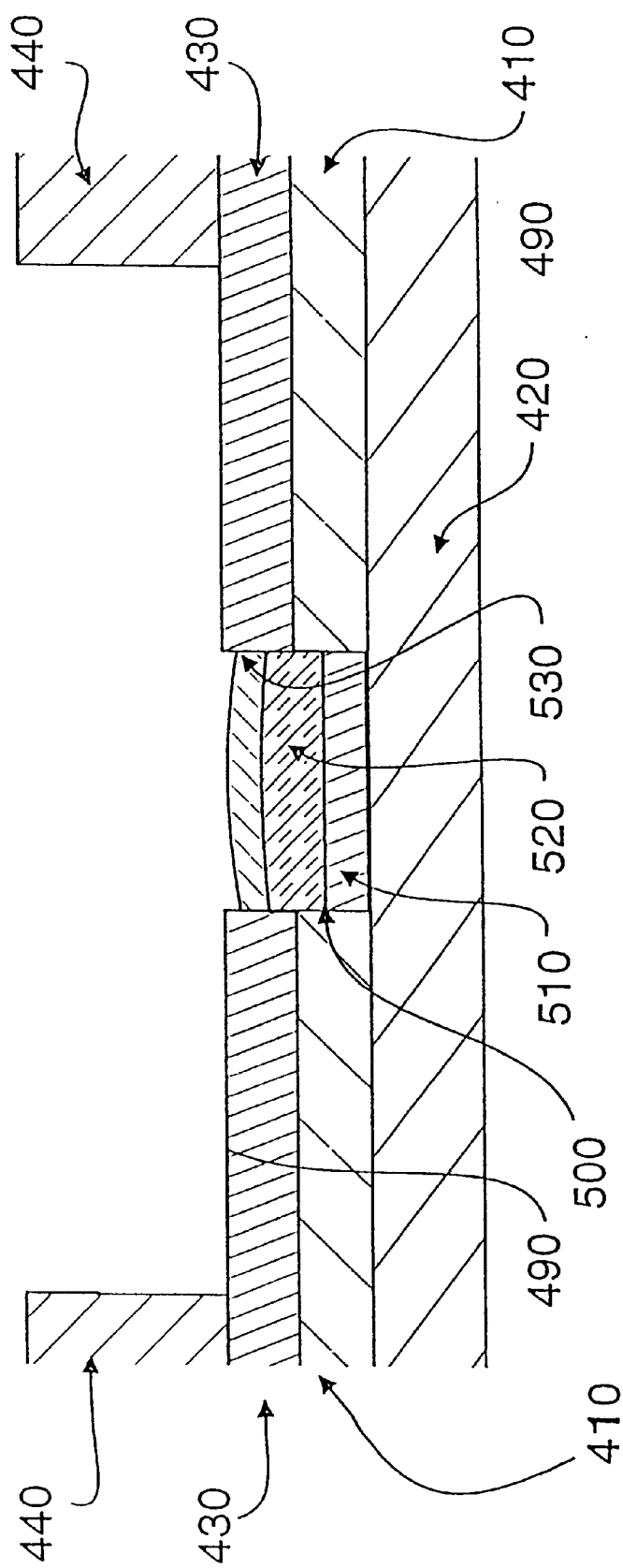
FIG. 43 is a fragmentary cross sectional view of the structure of FIG. 42 following a wet etch process to remove the remaining portion of the layer of silicon dioxide.
Figure 44:
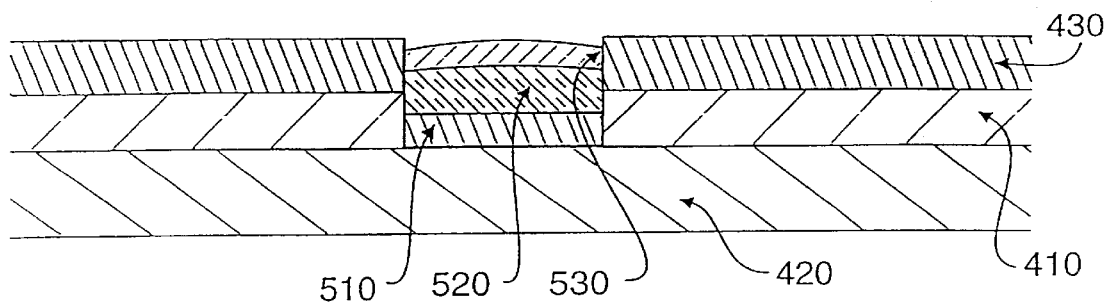
FIG. 44 is a fragmentary cross sectional view of the structure of FIG. 43 following a chemical mechanical polishing (CMP) operation.

Referring to FIG. 42, the disposable spacer 490 of polysilicon may now be removed using a conventional wet etch process using, for example, $NH_4OH$. The remaining portion of the layer 540 of TEOS also protects the materials within the pore 500 during this operation. Finally, referring to FIG. 43, the remaining portion of the layer 540 of TEOS may be removed using a conventional oxide wet etch process. In preparation for the final processing steps, the structure illustrated in FIG. 43 may then be subjected to a conventional chemical mechanical polishing (CMP) operation as shown in FIG. 44 to provide a substantially planar topography.

Figure 45:
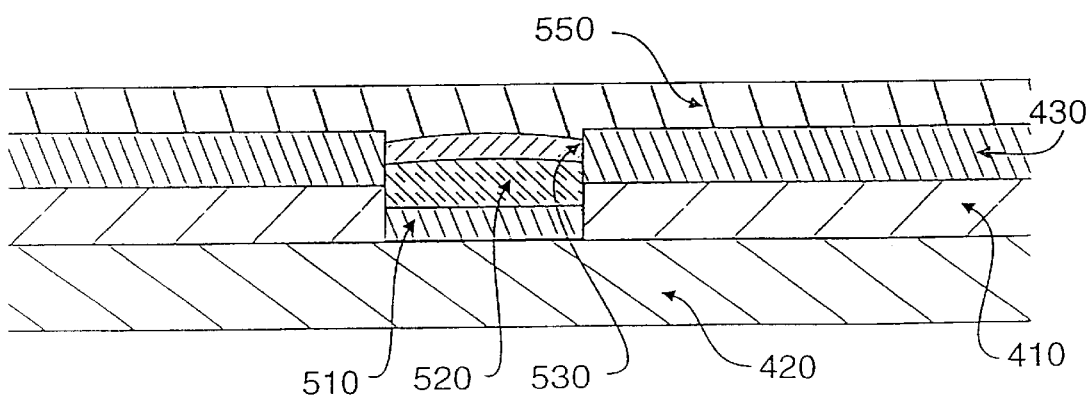
FIG. 45 is a fragmentary cross sectional view of the structure of FIG. 44 following the deposition of a layer of silicon dioxide.
Figure 46:
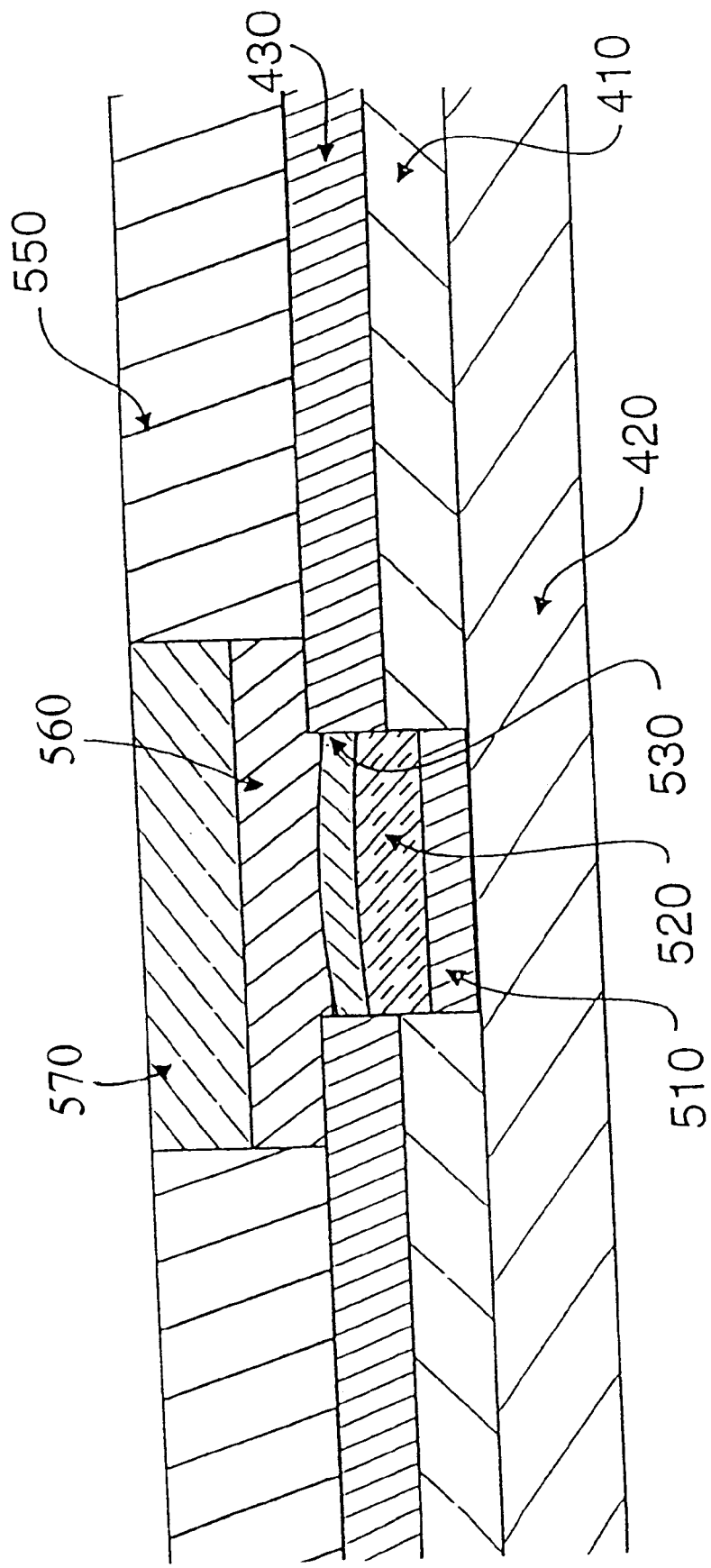
FIG. 46 is a fragmentary cross sectional view of the structure of FIG. 45 following a masking and etching operation to expose the upper layer of carbon followed by the successive deposition of a TiN barrier metal layer and an aluminum metalization layer.

The remaining processing steps illustrated in FIGS. 45 and 46 permit electrical connection of the chalcogenide memory cell within the pore 500 to a conductive upper grid. As illustrated in FIG. 45, an insulating layer 550 of silicon dioxide may then be deposited using conventional thin film deposition methods. The layer 550 may then be masked and etched using conventional methods to provide access to the upper layer 530 of carbon within the pore 500. A conductive layer 560 of a barrier metal such as, for example, TiN is then deposited using conventional thin film deposition methods. The conductive layer 560 may comprise a conductive material such as, for example, TiN, TiW, or TiAl, and preferably it comprises TiN. The conductive layer 560 may range in thickness from approximately 100 to 2000 Angstroms, and preferably it is 500 Angstroms in thickness. A conductive layer 570 of aluminum may then be applied using conventional metallization processes. The conductive layer 570 preferably comprises an upper conductive grid for an array of chalcogenide memories. The conductive layer 570 may comprise a conductive material such as, for example, aluminum alloy, TiW, or CVD W on TiN, and preferably it comprises Al/Cu. The conductive layer 570 may range in thickness from approximately 100 to 10,000 Angstroms, and preferably it is 7500 Angstroms in thickness.

In a particularly preferred embodiment, the methods described are utilized to form an array of chalcogenide memory cells which are addressable by an X-Y grid of upper and lower conductors. In the particularly preferred embodiment, diodes are further provided in series with the chalcogenide memories in order to permit read/write operations from/to individual chalcogenide memory cells as will be recognized by persons of ordinary skill in the art.

A method has been described for fabricating ultra-small pores for use in chalcogenide memory cells using disposable internal spacers. More generally, the present method will also provide ultra-small plug contacts or vias in semiconductor devices such as, for example, static random access and dynamic random access memories. Such semiconductor devices require contacts to permit electrical connection to active regions of memory elements. The present method of forming will also provide ultra-small contacts or vias in semiconductor devices generally thereby permitting further reduction in the physical size of such devices. The ultra-small pores are further utilized in the present method to fabricate chalcogenide memory cells which are contained within the ultra-small pores.

While the invention is susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the appended claims.

What is claimed is:

1. A microelectronic structure comprising:

a substrate;

a first dielectric layer disposed on the substrate, the first dielectric layer having an aperture therein;

a second dielectric material disposed only within the aperture, the second dielectric material having a pore therein exposing a portion of the substrate; and a spacer disposed above the second dielectric material.

2. The structure, as set forth in claim 1, wherein the substrate comprises a conductive material.

3. The structure, as set forth in claim 1, wherein the first dielectric layer comprises oxide.

4. The structure, as set forth in claim 1, wherein the first dielectric layer comprises TEOS oxide.

5. The structure, as set forth in claim 1, wherein the second dielectric material comprises silicon nitride.

6. The structure, as set forth in claim 1, wherein the spacer comprises polysilicon.

7. The structure, as set forth in claim 1, wherein the spacer and second dielectric material have equal widths.

8. The structure, as set forth in claim 1, comprising a chalcogenide memory element disposed within the pore.

9. The structure, as set forth in claim 8, wherein the chalcogenide memory element comprises:

a first conductive layer disposed over the substrate;

a layer of chalcogenide material disposed over the first conductive layer; and a second conductive layer disposed over the layer of chalcogenide.

10. The structure, as set forth in claim 8, comprising a third dielectric layer disposed over the chalcogenide memory element.

11. The structure, as set forth in claim 9, wherein:

the first conductive layer includes a first portion disposed over the spacer;

the layer of chalcogenide material includes a first portion disposed over the first portion of the first conductive layer; and the second conductive layer includes a first portion disposed over the first portion of the layer of chalcogenide.

* * * * *